(12) United States Patent
Mattisson et al.

(10) Patent No.: US 10,826,433 B2
(45) Date of Patent: *Nov. 3, 2020

(54) PASSIVE MIXER WITH REDUCED SECOND ORDER INTERMODULATION

(71) Applicant: Telefonaktiebolaget LM Ericsson (publ), Stockholm (SE)

(72) Inventors: Sven Mattisson, Lomma (SE); Pietro Andreani, Lund (SE); Daniele Mastantuono, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 16/550,701

(22) Filed: Aug. 26, 2019

(65) Prior Publication Data

US 2019/0379327 A1  Dec. 12, 2019

Related U.S. Application Data

(60) Division of application No. 15/816,349, filed on Nov. 17, 2017, now Pat. No. 10,411,650, which is a
(Continued)

(51) Int. Cl.
*H03D 1/04* (2006.01)
*H03D 7/14* (2006.01)
(Continued)

(52) U.S. Cl.
CPC ............... *H03D 1/04* (2013.01); *H03D 7/12* (2013.01); *H03D 7/1458* (2013.01);
(Continued)

(58) Field of Classification Search
CPC .................. H03D 1/04; H03D 7/12–7/165
(Continued)

(56) References Cited

U.S. PATENT DOCUMENTS

| 3,917,964 A | 11/1975 | Carlson |
| 4,949,398 A | 8/1990 | Maas |

(Continued)

FOREIGN PATENT DOCUMENTS

| CA | 2375438 A1 | 9/2003 |
| EP | 2079162 A1 | 7/2009 |

(Continued)

OTHER PUBLICATIONS

Sjöland, H. et al. "A Merged CMOS LNA and Mixer for a WCDMA Receiver." IEEE Journal of Solid-State Circuits, vol. 38, No. 6, Jun. 2003, pp. 1045-1050.
(Continued)

*Primary Examiner* — Gennadiy Tsvey
(74) *Attorney, Agent, or Firm* — Coats & Bennett, PLLC

(57) ABSTRACT

The present disclosure generally relates to the field of receiver structures in radio communication systems and more specifically to passive mixers in the receiver structure and to a technique for converting a first signal having a first frequency into a second signal having a second frequency by using a third signal having a third frequency. A passive mixer for converting a first signal having a first frequency into a second signal having a second frequency by using a third signal having a third frequency comprises a cancellation component for generating a first cancellation signal for cancelling second order intermodulation components by superimposing the first signal weighted by a cancellation value on the third signal; and a mixing component having a first terminal for receiving the first signal, a second terminal for outputting the second signal, and a third terminal for receiving the first cancellation signal, wherein the mixing component is adapted to provide the second signal as output at the second terminal by mixing the first signal provided as
(Continued)

input at the first terminal and the first cancellation signal provided as input at the third terminal.

17 Claims, 15 Drawing Sheets

Related U.S. Application Data continuation of application No. 13/503,168, filed as application No. PCT/EP2009/007609 on Oct. 23, 2009, now Pat. No. 9,825,590.

(51) Int. Cl.
*H03D 7/12* (2006.01)
*H03D 7/16* (2006.01)

(52) U.S. Cl.
CPC .......... *H03D 7/1466* (2013.01); *H03D 7/165* (2013.01); *H03D 2200/0088* (2013.01)

(58) Field of Classification Search
USPC ........................................ 455/313–333, 295
See application file for complete search history.

(56) References Cited

U.S. PATENT DOCUMENTS

| | | | |
|---|---|---|---|
| 5,060,298 A | 10/1991 | Waugh et al. |
| 5,263,198 A | 11/1993 | Geddes et al. |
| 5,606,738 A | 2/1997 | Onodera et al. |
| 6,218,892 B1 | 4/2001 | Soumyanath et al. |
| 7,263,344 B2 | 8/2007 | Manku |
| 7,277,682 B2 | 10/2007 | Zhou |
| 7,622,983 B2 | 11/2009 | Thomas et al. |
| 8,045,944 B2 | 10/2011 | Zhuo et al. |
| 8,050,644 B1 | 11/2011 | Cosand et al. |
| 8,175,515 B1 | 5/2012 | Rivera |
| 2001/0008383 A1 | 7/2001 | Nishida et al. |
| 2003/0162515 A1 | 8/2003 | Zhou |
| 2003/0216128 A1 | 11/2003 | Zhou |
| 2006/0057998 A1 | 3/2006 | Perumana et al. |
| 2007/0072576 A1 | 3/2007 | Sjoland et al. |
| 2007/0132500 A1 | 6/2007 | Embabi et al. |
| 2007/0197185 A1 | 8/2007 | Bayruns et al. |
| 2008/0024223 A1 | 1/2008 | Park et al. |
| 2009/0075619 A1 | 3/2009 | Mitomo et al. |
| 2009/0075622 A1 | 3/2009 | Zhuo et al. |
| 2009/0111377 A1 | 4/2009 | Mitomo et al. |
| 2009/0140789 A1 | 6/2009 | Birth |
| 2012/0161862 A1 | 6/2012 | Uzunov et al. |

FOREIGN PATENT DOCUMENTS

| | | |
|---|---|---|
| JP | 2008103970 A | 5/2008 |
| JP | 2008118176 A | 5/2008 |
| JP | 2009111632 A | 5/2009 |

OTHER PUBLICATIONS

Ali-Ahmad, W. "Effective IM2 estimation for two-tone and WCDMA modulate blockers in zero-IF." Agilent EEsof EDA, Agilent Technologies, Inc, Apr. 1, 2004, pp. 32-40.

Chehrazi, S. et al. "Second-Order Intermodulation in Current-Commutating Passive FET Mixers." IEEE Transactions on Circuits and Systems-I: Regular Papers, vol. 56, No. 12, Dec. 2009, pp. 2556-2568.

Kim, Myoung-Gyun et al., "A Low-Voltage, Low-Power, and Low-Noise UWB Mixer Using Bulk-Injection and Switched Biasing Techniques," IEEE Transactions on Microwave Theory and Techniques, Aug. 2012, pp. 2486-2493, vol. 60, No. 8.

PASSIVE MIXER WITH REDUCED SECOND ORDER INTERMODULATION

RELATED APPLICATIONS

This application is a divisional application of pending U.S. Ser. No. 15/816,349, filed Nov. 17, 2017, which is a continuation application of U.S. Ser. No. 13/503,168, filed Jun. 13, 2012, which issued as U.S. Pat. No. 9,825,590 on Nov. 21, 2017, which is the National Stage of International Patent Application PCT/EP2009/007609, filed Oct. 23, 2009, the disclosures of which are incorporated herein by reference in their entireties.

TECHNICAL FIELD

The invention generally relates to the field of receiver structures in radio communication systems. More specifically, the invention relates to passive mixers in the receiver structures and to a technique for converting a first signal having a first frequency into a second signal having a second frequency by using a third signal having a third frequency.

BACKGROUND

In radio communication systems, a mixer is used to up-convert a baseband (BB) signal or an intermediate frequency (IF) signal to a higher frequency, e.g. a radio frequency (RF) signal, for ease of transmission (when the mixer is used in a transmitter) or to down-convert a high frequency signal, e.g. an RF signal, to a lower frequency signal, e.g. a BB signal or an IF signal, for ease of signal processing (when the mixer is used in a receiver). The up-conversion or down-conversion is respectively performed by mixing the input signal of the mixer with a local oscillator (LO) signal generated by a local oscillator. In the receiver case, the RF signal is mixed with the LO signal in order to generate an IF signal or a BB signal.

In some mobile radio communication devices, the transmitter and receiver architectures are separated, i.e. separate circuitries are used for the receiver and the transmitter. However, in other mobile communication devices, a transceiver is used, which is a device that has both a transmitter and a receiver, which are combined and share common circuitry. Transceivers normally include a duplexer which is a device that allows simultaneous bi-directional (full duplex) communication over a single channel. In radio communication systems, the duplexer isolates the receiver from the transmitter while permitting them to share a common antenna.

A challenge in modern radio communication systems has been, and continues to be, to design receivers (and transmitters) that can meet increasingly strict performance standards while fitting into ever shrinking packages. To this end, many modern radio receivers (and transmitters) are implemented on a single application specific integrated circuit (ASIC). One of these strict performance standards is the intermodulation requirement, in particular the so called second order intermodulation (IM2) requirement. Intermodulation can only occur in nonlinear systems. Nonlinear systems are generally composed of active components, meaning that the components must be biased with an external power source which is not the input signal (i.e. the active components must be "turned on"). However, even passive components can perform in a non-linear manner and cause intermodulation. Diodes or transistors are widely known for their passive nonlinear effects, but parasitic nonlinearity can arise in other components as well. For example, audio transformers exhibit non-linear behavior near their saturation point, electrolytic capacitors can start to behave as rectifiers under large-signal conditions, and RF connectors and antennas can exhibit nonlinear characteristics.

In the receiver case, a passive mixer generates IF or BB signals that result from the sum and difference of the LO and RF signals combined in the mixer. These sum and difference signals at the IF port are of equal amplitude, but generally only the difference signal is desired for processing and demodulation so the sum frequency (also known as the image signal) must be removed, typically by means of IF bandpass or BB lowpass filtering.

In the nonlinear case, further higher order components (caused by harmonics), like IM2 components, typically occur at the mixer output. The Second Order Intercept Point (IP2) is a measure of linearity that quantifies the second-order distortion generated by nonlinear systems and devices. At low power levels, the fundamental output power rises in a one-to-one ratio (in terms of dB) of the input power, while the second-order output power rises in a two-to-one ratio. When the input power is high enough and the device reaches saturation, the output power flattens out in both the first- and second-order cases. The second order intercept point is the point at which the first- and second-order lines intersect, assuming that the power levels do not flatten off due to saturation. In other words, the IP2 is the theoretical point on the RF input vs. IF output curve where the desired input signal and second order products become equal in amplitude as the RF input is raised.

Zero- and low-IF receiver architectures dominate today's low-cost wireless receiver market for Time Division Multiple Access (TDMA) and Time Division Duplex (TDD) systems. For Frequency Division Multiple Access (FDMA) systems and Code Division Multiple Access (CDMA) systems, like Wideband Code Division Multiple Access (WCDMA) systems, the strict IM2 and IP2 requirements typically necessitate more complex receiver solutions.

In a TDMA or TDD system, the wireless transmitter and receiver are not on at the same time but only in different, non-overlapping, time slots. Thus, for these systems the strongest receiver (Rx) interference is due to an external transmitter, picked up via the antenna of the TDMA or TDD system. In FDMA or in CDMA systems, like in a WCDMA system, the strongest Rx interferer is typically the wireless transmitter (Tx) itself, via leakage through the duplex filter of the system. Since the transmitter leakage at full power typically is >10 dB stronger than any external interferer, this will mainly set the IM2 and IP2 requirements.

For example, a WCDMA transmitter at +25 dBm power will result in a −25 dBm Rx signal when the dupJexer attenuation is 50 dB. If only −108 dBm static Rx interference (an interference that is present all the time) is acceptable, the receiver IP2 has to be >+44 dBm for the rectified Tx spectrum to be below the −108 dBm limit. For, e.g., GSM (Global System for Mobile Communications), the strongest interferer is 5 dB lower or −30 dBm, resulting in a 10 dB lower IP2 requirement for the same distortion levels.

Up till now, the common remedy for the high transmitter leakage levels has been to introduce a filter between the low noise amplifier (LNA) and the mixer of the receiver, typically an active mixer for noise reasons. Because of the small relative frequency separation between the closest Tx and Rx band edges, i.e. the duplex gap, this filter typically is a Surface Acoustic Wave (SAW) filter which cannot be integrated into the transceiver ASIC, but has to be located on the printed circuit board (PCB) or module substrate, adding to the cost and complexity of the receiver structure.

Recently, alternating current (AC) coupling between the LNA and the mixer core has been employed as a means to enhance IP2 by blocking low-frequency IM2 noise to enter the mixer core, thereby preventing any leakage due to mixer imbalances.

A passive metal oxide semiconductor (MOS) mixer offers good performance in terms of noise and linearity, especially when it's BB or IF port is at a virtual ground. The virtual ground eliminates the modulation of the mixer switches by the BB or IF signal which improves IP2. Due to the inherent nature of the MOS device, its switching threshold and channel conductance depends on the LO, RF and IF signals. These interdependences will generate cross products of these signals, including ones that cause IM2. By grounding the IF port, e.g. via a virtual ground, some of these cross products can be reduced resulting in less IM2 and consequently a higher IP2. Still the switching threshold will be modulated by the RF signal, resulting in an IM2 contribution in addition to that of the nonlinear channel conductance.

Today's AC-coupled mixer solutions provide enough performance when the duplexer isolation is 50 dB or better. For newer band configurations with smaller duplex gaps and thus less duplexer isolation this may not be possible. Also for cost reasons it may be advantageous to relax these duplexer requirements, e.g. by allowing duplexers with less duplexer isolation, by improving the mixer IP2.

SUMMARY

Accordingly, there is a need to provide an improved and more cost efficient passive mixer having improved IP2 performance.

This need is satisfied, according to a first aspect, by a passive mixer for converting a first signal having a first frequency into a second signal having a second frequency by using a third signal having a third frequency. The passive mixer comprises a cancellation component for generating a first cancellation signal for cancelling second order intermodulation components by superimposing the first signal weighted by a cancellation value on the third signal; and a mixing component having a first terminal for receiving the first signal, a second terminal for outputting the second signal, and a third terminal for receiving the first cancellation signal, wherein the mixing component is adapted to provide the second signal as output at the second terminal by mixing the first signal provided as input at the first terminal and the first cancellation signal provided as input at the third terminal.

According to a second aspect, the above need is satisfied by a further passive mixer for converting a first signal having a first frequency into a second signal having a second frequency by using a third signal having a third frequency. The passive mixer comprises a cancellation component for generating a second cancellation signal for cancelling second order intermodulation components by superimposing the first signal weighted by a cancellation value on a bias, or reference, voltage; and a mixing component having a first terminal for receiving the first signal, a second terminal for outputting the second signal, a third terminal for receiving the third signal, and a fourth terminal for receiving the second cancellation signal, wherein the mixing component is adapted to provide the second signal as output at the second terminal by mixing the first signal provided as input at the first terminal and the third signal provided as input at the third terminal together with the second cancellation signal provided as input at the fourth terminal.

The cancellation component according to both aspects may be adapted to apply only one of the first and second cancellation signals or both the first cancellation signal and the second cancellation signal. It is conceivable that the mixing component may comprise four terminals, the first to fourth terminals according to the second aspect, but may only use three of the four terminals, e.g. the first to third terminals. For example, the three terminals are used by providing them with the respective signals, the fourth terminal remains unused and the mixing component then generates the first cancellation signal without considering the fourth signal (bias voltage). If the bias voltage would additionally be provided, the mixing component may generate the second cancellation signal using the four terminals. The mixing component may be adapted to receive both the first and second cancellation signals and to provide the second signal as output at the second terminal by mixing the first signal provided as input at the first terminal and the first cancellation signal provided as input at the third terminal together with the second cancellation signal provided as input at the fourth terminal.

In accordance with both aspects, the mixing component may comprise a voltage controlled switch. For example, the mixing component comprises a field effect transistor switch, like a Metal Oxide Semiconductor Field Effect Transistor (MOSFET), a Junction Field Effect Transistor (JFET), a Metal Semiconductor Field Effect Transistor (MESFET) and the like or a transistor providing similar characteristics as a field effect transistor, like an Insulated Gate Bipolar Transistor (IGBT). The field effect transistor switch may have its drain operatively connected to the first terminal, its gate operatively connected to the third terminal and its source operatively connected to the second terminal. In particular according to the second aspect, the field effect transistor switch may have its drain operatively connected to the first terminal, its gate operatively connected to the third terminal, its source operatively connected to the second terminal and its bulk connected to the fourth terminal.

As is well known, source and drain may be interchanged for a symmetric device and what constitutes the drain and the source of a field effect transistor may be bias, or signal, dependent. For simplicity, but without loss of generality, we assume that the drain is connected to the first terminal and the source to the second terminal. The mixing component may alternatively comprise more than one voltage controlled switch, for example two complementary voltage controlled switches. In this case, one N-channel transistor and one P-channel transistor may be connected in parallel to each other, and may share the first and second terminals, but may have distinct third terminals and, in case of the second aspect, distinct fourth terminals, e.g. distinct gate and bulk terminals.

The passive mixer may be used in a receiver arrangement for example of a transceiver comprising both a transmitter and a receiver. In this case, the passive mixer may be used in at least one of the receiver and the transmitter of the transceiver. For example, the passive mixer is realized as an integrated circuit provided on the same application specific integrated circuit (ASIC) as the transceiver.

According to a first variant, the passive mixer may be arranged in the receiver. The first signal may then be a radio frequency (RF) signal received by the receiver, the third signal may be a local oscillator (LO) signal provided by a local oscillator arranged in the receiver, and the second signal may be one of an intermediate frequency (IF) signal and a baseband (BB) signal dependent on whether the passive mixer is adapted to perform direct conversion or indirect conversion. When the passive mixer is adapted to perform indirect conversion, the received RF signal is down-converted by the passive mixer into an IF signal having a center frequency different from zero. The IF signal may then be further down-converted by a similar or a different mixer into a BB signal. In case of direct conversion, the RF signal is directly converted into a BB signal having a center frequency equal to zero, i.e. having a spectrum of a certain bandwidth around zero.

According to a second variant, which can be combined with the first variant, the passive mixer may be arranged in the transmitter. The first signal may then be one of an IF signal and a BB signal dependent on whether the passive mixer is adapted to perform direct conversion or indirect conversion, the third signal may be an LO signal provided by an LO arranged in the transmitter, and the second signal may be an RF signal to be transmitted by the transmitter.

The second order intermodulation (IM2) components to be cancelled may comprise terms dependent on the voltage at the first terminal of the mixing component (the input voltage of the mixing component). According to one variant, the second terminal (output terminal) of the mixing component connected to a virtual ground or may have a voltage close to ground such that the voltage swing at this terminal is very low compared to the voltage swing of the first terminal. The IM2 components may then be proportional to the square of the voltage at the first terminal. Alternatively, in accordance with another variant, the voltage swing at the second terminal may not be much less than that of the first terminal and the I 2 components may be dependent on both the voltage at the first terminal and the voltage at the second terminal. For example, the IM2 components are dependent on the voltage difference between the voltage at the first terminal and the voltage at the second terminal.

In order to cancel the IM2 components, both the cancellation values for the first cancellation signal and the second cancellation signal may be set as fixed values. For example, both cancellation values may be equal to 0.5 or a value close to 0.5. Alternatively, the cancellation values may initially be set to the fixed value and may then be adapted when the operating conditions of the passive mixer change, e.g. when the temperature of the passive mixer changes during operation. In yet another example, one cancellation value may be fixed and the other may be adapted to a value that depends on one or more of the operating conditions, device mismatches, process spread or temperature.

As outlined above, the mixing component may comprise a field effect transistor switch having its drain operatively connected to the first terminal, its gate operatively connected to the third terminal and its source operatively connected to the second terminal. In accordance therewith, the IM2 components to be cancelled may comprise a term proportional to the second order of the drain source voltage.

According to a first realization of both the first and second aspect, the passive mixer may be used in current mode, i.e. the second terminal (output terminal) of the mixing component may be grounded or may be at virtual ground. If the mixing component in this realization comprises a field effect transistor switch, the drain of the field effect transistor may receive the RF signal and the source of the field effect transistor may be connected to ground or to virtual ground. In order to determine the quantity of the IM2 components, which may be proportional to the square of the drain source voltage of the field effect transistor, a first sensing component may be used for sensing the voltage at the first terminal, e.g. the voltage at the drain of the field effect transistor. In the current mode (the first realization) the second terminal (output terminal) of the passive mixer is connected to ground or to virtual ground, so that, as outlined above, the IM2 components may be proportional to the square of the voltage at the first terminal, i.e. the square of the voltage of the RF signal. In order to determine the cancellation value for weighting the first signal, e.g. the F signal, in accordance with the first realization, the voltage sensed at the first terminal by the first sensing component may be considered. According to the first aspect, the weighted first signal, e.g. the weighted RF signal, may then be superimposed on the third signal, e.g. the local oscillator signal, in order to generate the first cancellation signal. Alternatively, in accordance with the second aspect, the weighted first signal, e.g. the weighted RF signal, may be superimposed on the bias voltage, e.g. the bulk voltage of the field effect transistor, in order to generate the second cancellation signal. In line with the first realization of the first aspect, the first sensing component may be connected to the first terminal and to the cancellation component, in order so sense the voltage at the first terminal and in order to provide the weighted first signal to the cancellation component. Likewise, the cancellation component may be connected to the first terminal via the first sensing component and to the third terminal in order to receive the weighted first signal and to superimpose the weighted first signal and the third signal. In accordance with the first realization of the second aspect, the first sensing component may be connected to the first terminal and to the cancellation component, in order to sense the voltage at the first terminal and in order to provide the weighted first signal to the cancellation component. Likewise, the cancellation component may be connected to the first terminal via the first sensing component and to the fourth terminal in order to receive the weighted first signal and to superimpose the weighted first signal and the bias voltage.

Alternatively, in a second realization in particular of the first aspect, the second terminal of the mixing component may not be connected to a virtual ground and the passive mixer may not be used in current mode, but in voltage mode. In the voltage mode, the second terminal of the mixing component, e.g. the source of the field effect transistor, is not connected to a virtual-ground node, but may be connected to a capacitor which itself may be connected to ground. In this way, the second terminal of the mixing component may be loaded by the capacitor that may provide an RF short to ground. The RF signal at the first terminal and the IF signal or BB signal at the second terminal may be widely separated in frequency. Therefore, the voltages at the first terminal and the second terminal may be sensed independently from each other.

For example, the passive mixer comprises, in addition to the first sensing component for sensing the voltage at the first terminal, a second sensing component for sensing the voltage at the second terminal. The second sensing component may be connected to the second terminal in order to sense the voltage at the second terminal and to the cancellation component in order provide the cancellation component with the information about the sensed voltage at the second terminal. The cancellation component may not only be connected to the first sensing component and to the third terminal but may further be connected to the second terminal via the second sensing component in order to generate the first cancellation signal by not only considering the sensed voltage at the first terminal but by additionally considering the sensed voltage at the second terminal.

In accordance with a further variant, the passive mixer may further comprise two or more mixing components and a more-phase generator for generating the third signal with two or more different phases. According to this variant, the more-phase generator may be supplied by two opposing signal sources and may in this way float with respect to ground in order to generate two or more phases of the third signal. The two opposing current sources for supplying signal with opposing phases may by locally decoupled via a capacitor. The different phases of the third signal may be individually fed into one or more of the two or more mixing components. For example, both of the two or more different phases may be fed into all of the two or more mixing components. Alternatively, one of the different phases may be supplied to one of the mixing components, another of the different phases may be supplied to another one of the mixing components and so on.

For example, in accordance with this further variant, the first signal weighted by the cancellation value is superimposed on one phase of the third signal and the first signal weighted by the same or an adapted cancellation value is superimposed on another phase of the third signal in order to generate the first cancellation signal having multiple phases. In case of several different phases of the third signal, each phase of the third signal may be modulated with the appropriate weighted first signal in order to generate the first cancellation signal at the respective mixing component.

In accordance with the second aspect, the cancellation component may be adapted to generate the second cancellation signal by superimposing the first signal weighted by the cancellation value on the bias voltage. The different phases of the third signal may then be provided to the third terminal of one or more of the two or more mixing components.

In accordance with both aspects, it may also be possible to turn off the weighted first signal, e.g. the weighted RF signal, at the cancellation component in order to save power (e.g. by turning off the first sense amplifier), when the transmission power and thus the interference introduced into the receiver is lower than a certain threshold. Additionally to the IM2 components from the own transmitter, the passive mixer may be adapted to also consider IM2 due to other devices, e.g. base stations.

The above need is also satisfied, according to a third aspect, by a transceiver apparatus comprising a transmitter for transmitting a radio frequency transmit signal and a receiver for receiving a radio frequency receive signal. The receiver of the transceiver apparatus comprises a low noise amplifier for amplifying the high frequency receive signal; and a passive mixer comprising a local oscillator for generating a local oscillator signal; a cancellation component for generating a first cancellation signal for cancelling second order intermodulation components by superimposing the amplified radio frequency receive signal weighted by a cancellation value on the local oscillator signal; and a mixing component having a first terminal for receiving the amplified radio frequency receive signal, a second terminal for outputting one of an intermediate frequency signal and a baseband signal, and a third terminal for receiving the first cancellation signal, wherein the mixing component is adapted to provide one of the intermediate frequency signal and the baseband signal as output at the second terminal by mixing the amplified radio frequency receive signal provided as input at the first terminal and the first cancellation signal provided as input at the third terminal.

According to a fourth aspect, the above need is satisfied by a further transceiver apparatus comprising a transmitter for transmitting a radio frequency transmit signal and a receiver for receiving a radio frequency receive signal. The receiver of the transceiver apparatus comprises a low noise amplifier for amplifying the high frequency receive signal; and a passive mixer comprising a local oscillator for generating a local oscillator signal; a cancellation component for generating a second cancellation signal for cancelling second order intermodulation components by superimposing the amplified radio frequency receive signal weighted by a cancellation value on a bias voltage; and a mixing component having a first terminal for receiving the amplified radio frequency receive signal, a second terminal for outputting one of an intermediate frequency signal and a baseband signal, a third terminal for receiving the local oscillator signal, and a fourth terminal for receiving the second cancellation signal, wherein the mixing component is adapted to provide one of the intermediate frequency signal and the baseband signal as output at the second terminal by mixing the amplified radio frequency receive signal provided as input at the first terminal and the local oscillator signal provided as input at the third terminal together with the second cancellation signal provided as input at the fourth terminal.

According to both, the third and the fourth aspect, the receiver may further comprise one of a bandpass filter and a lowpass filter connected to the second terminal. In case of direct conversion, i.e. when the passive mixer is adapted to directly convert the radio frequency receive signal into a baseband signal, a lowpass filter may typically be connected to the second terminal of the mixing component for filtering the baseband signal via a passband of a predetermined frequency range. In case of indirect conversion, i.e. when the passive mixer is adapted to convert the radio frequency receive signal into an intermediate frequency signal, a bandpass filter having a passband of a predetermined frequency range may typically be connected to the second terminal of the mixing component for filtering the intermediate frequency signal output at the second terminal. The lowpass filter may be augmented by AC coupling (i.e. a highpass filter) when there is little signal energy at DC (e.g. for WCDMA) and the bandpass filter may be implemented as a combination of a high-pass (or AC coupling) and a lowpass filter.

According to a fifth aspect, a mobile communication terminal is provided, the mobile communication terminal comprising the transceiver apparatus according to the third or fourth aspect as outlined above.

The above need is further satisfied, according to a sixth aspect, by a method for converting a first signal having a first frequency into a second signal having a second frequency by using a third signal having a third frequency. The method comprises the steps of generating, by a cancellation component, a first cancellation signal for cancelling second order intermodulation components by superimposing the first signal weighted by a cancellation value on the third signal; receiving, at a first terminal of a mixing component, the first signal; receiving, at a third terminal of the mixing component, the first cancellation signal; and outputting, at a second terminal of the mixing component, the second signal by mixing the first signal provided as input at the first terminal and the first cancellation signal provided as input at the third terminal.

According to a seventh aspect, the above need is satisfied by a further method for converting a first signal having a first frequency into a second signal having a second frequency by using a third signal having a third frequency. The method comprises the steps of generating, by a cancellation component, a second cancellation signal for cancelling second order intermodulation components by superimposing the first signal weighted by a cancellation value on a bias voltage; receiving, at a first terminal of a mixing component, the first signal; receiving, at a third terminal of the mixing component, the third signal; receiving, at a fourth terminal of the mixing component, the second cancellation signal; and outputting, at a second terminal of the mixing component, the second signal by mixing the first signal provided as input at the first terminal and the third signal provided as input at the third terminal together with the second cancellation signal provided as input at the fourth terminal.

The cancellation value with which the first signal is weighted in order to generate the first and second cancellation signals may be a fixed value, e.g. 0.5 or a value around 0.5. Alternatively, other values of the fixed cancellation values may be used which take into account the operating conditions, e.g. which provide a good compromise over process and temperature. It is also conceivable that a set of different cancellation values may be provided and that one of the set of different cancellation values may be selected based on the operating conditions. The set of fixed cancellation values may comprise different values for different operating conditions.

The cancellation value may also be determined based on a voltage sensed by a first sensing component at the first terminal. In addition, a voltage at the second terminal may be sensed by a second sensing component and the first cancellation signal, the second cancellation signal or both the first and the second cancellation signals may be generated by additionally considering the sensed voltage at the second terminal.

BRIEF DESCRIPTION OF THE DRAWINGS

In the following, the invention will further be described with reference to exemplary embodiments illustrated in the figures, in which.

DETAILED DESCRIPTION

Figure 13:
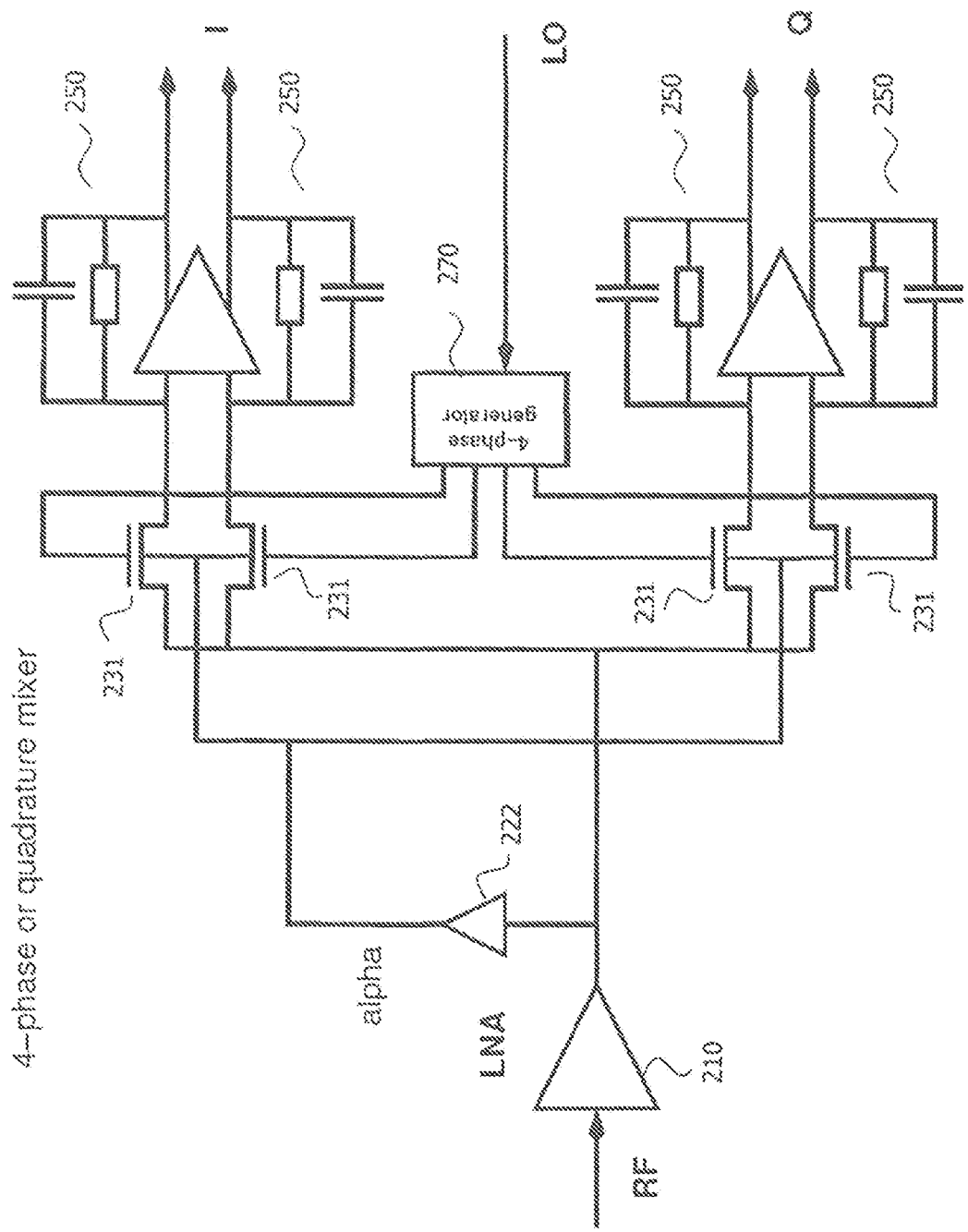
FIG. 13 is a schematic illustration of a ninth passive mixer embodiment of a receiver shown in FIG. 2.

FIG. 13 is a schematic illustration of a ninth passive mixer embodiment of a receiver shown in FIG. 2 In the following description, for purposes of explanation and not limitation, specific details are set forth, such as specific circuitries including particular components, elements etc., in order to provide a thorough understanding of the present invention. It will be apparent to one skilled in the art that the present invention may be practiced in other embodiments that depart from these specific details. For example, the skilled person will appreciate that the present invention, although explained below with respect to a Metal Oxide Semiconductor (MOS) Field Effect Transistor (FET), may make use of other transistors like a Junction Field Effect Transistor (J FET), a Metal Semiconductor Field Effect Transistor (MESFET), an Insulated Gate Bipolar Transistor (IGBT) or the like. For example, the invention may make use of n-channel MOSFETs, p-channel MOSFETs, n-channel JFETs or p-channel JFETs.

Those skilled in the art will further appreciate that functions explained herein below may be implemented using individual hardware circuitry and/or using an application specific integrated circuit (ASIC). The ASIC may be built from Field-programmable gate arrays (FPGAs), programmable logic devices (PLDs), like complex programmable logic devices (CPLDs), or any other standard parts known to those skilled in the art. It will also be appreciated that when the present invention is described as a method, this method may also be embodied on the ASIC.

Figure 1:
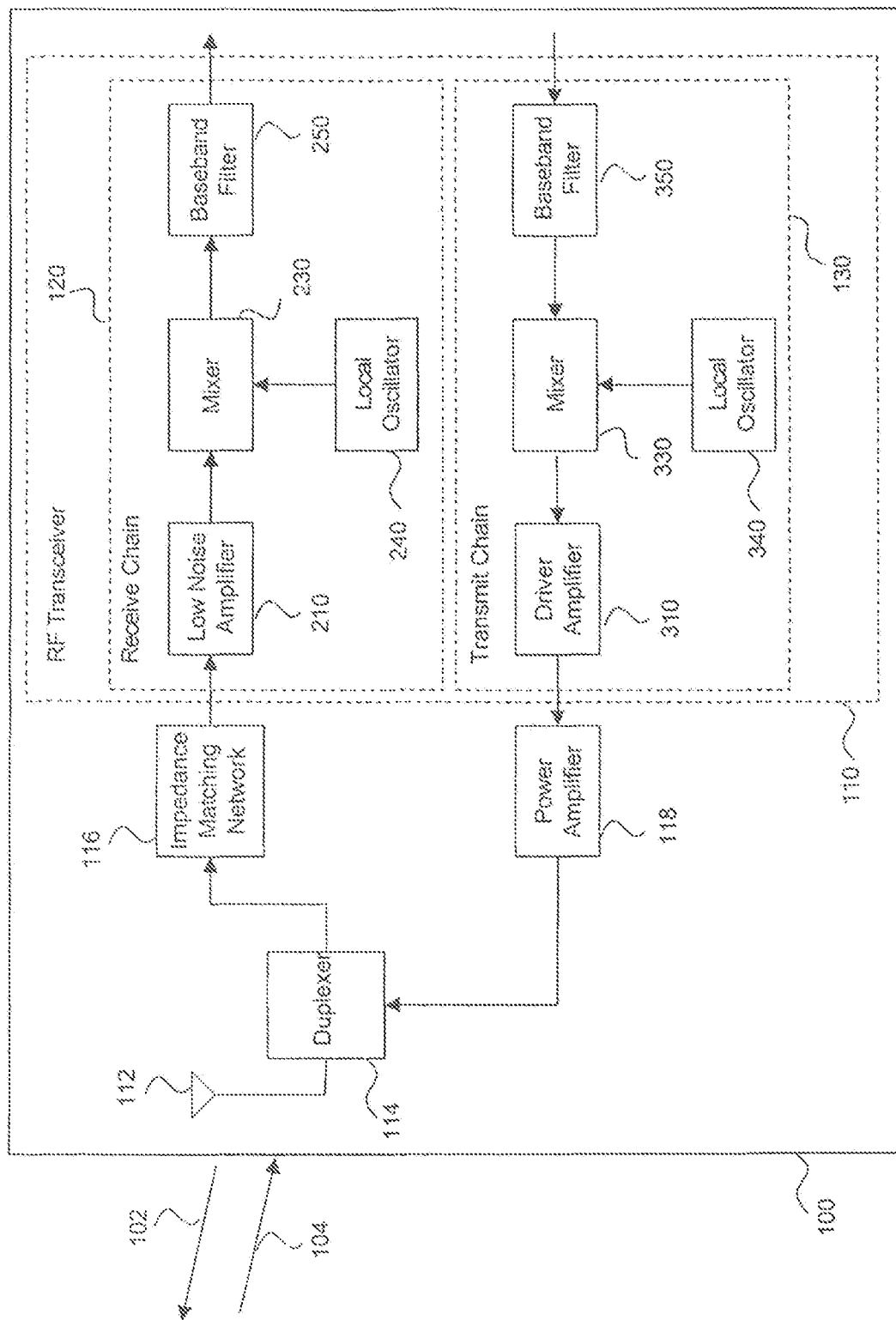
FIG. 1 is a block diagram schematically illustrating a transceiver apparatus embodiment.

FIG. 1 shows a block diagram of a radio frequency (RF) transceiver apparatus 110 for use in a mobile communication device 100. As schematically illustrated in FIG. 1, the mobile communication device 100 comprising the RF transceiver apparatus 110 is adapted to transmit a radio frequency transmit signal 102 from an antenna 112 and is adapted to receive a radio frequency receive signal 104 with the antenna 112. The mobile terminal comprises a duplexer 114 connected to the RF transceiver apparatus 110 via an impedance matching network 116 and a power amplifier 118, so that the transceiver apparatus 110 can be used for both transmitting the radio frequency transmit signal by means of a transmitter 130 and receiving the radio frequency receive signal by means of a receiver 120. The impedance matching network 116 is connected to the receiver 120 of the RF transceiver apparatus 110 and the power amplifier 118 is connected to the transmitter 130 of the RF transceiver apparatus 110.

The transmitter 130 of the RF transceiver apparatus 110 comprises a driver amplifier 310, a mixer 330, a local oscillator (LO) 340 and a baseband (BB) filter 350. The receiver 120 of the RF transceiver apparatus 110 comprises a low noise amplifier (LNA) 210, a mixer 230, a local oscillator (LO) 240 and a baseband (BB) filter 250. When the RF transceiver apparatus 110 is used in transmit mode, a data signal is passed to the BB filter 350, filtered by the BB filter 350 and passed to the mixer 330, where the BB data signal is up-converted into an RF signal using an LO signal generated by the LO 340. The RF signal is then passed to the driver amplifier 310, the power amplifier 118, the duplexer 114 and finally to the antenna 112 for transmitting the RF transmit signal 102. When the transceiver apparatus 110 is used in receive mode, an RF receive signal 104 is received by the antenna 112, is passed by the duplexer 114 to the impedance matching network 116 and then to the receiver 120 of the RF transceiver apparatus 110. In the receiver 120, the LNA 210 amplifies the RF receive signal, the mixer 230 directly down-converts the amplified RF receive signal into a BB signal by mixing the amplified RF receive signal with an LO signal generated by the LO 240 and then passes the BB signal to the BB filter 250 for further BB filtering and amplification.

Figure 2:
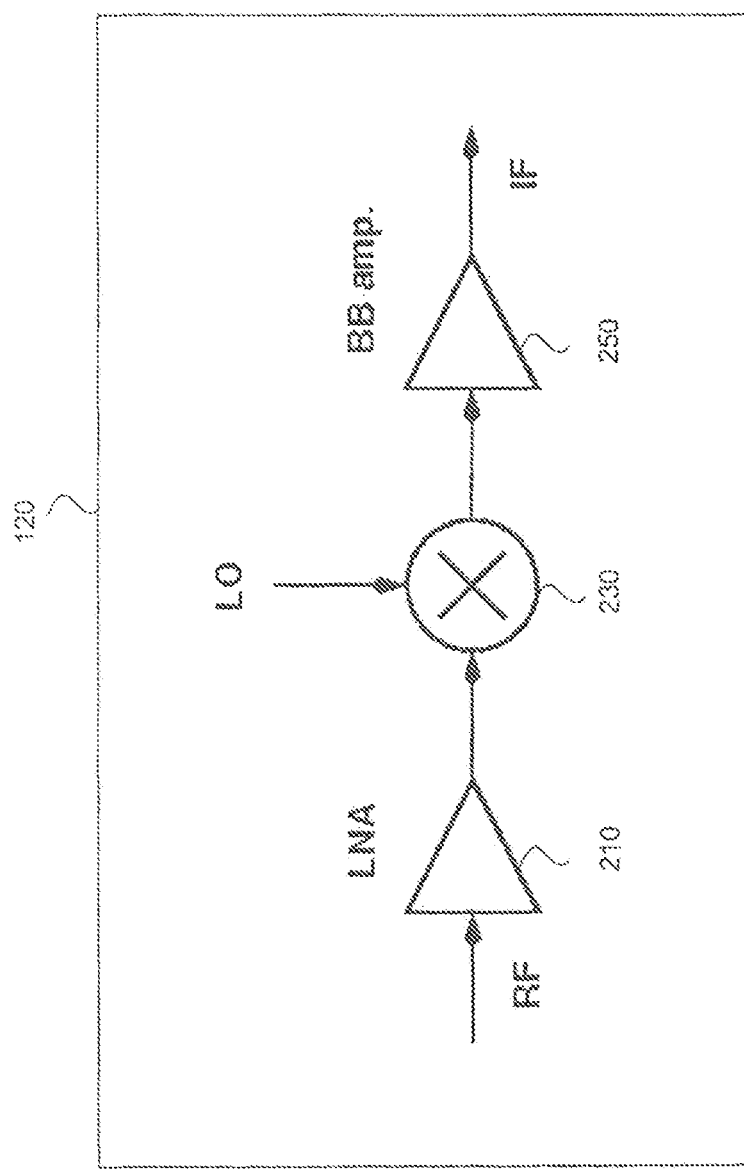
FIG. 2 is a schematic illustration of a receiver of the transceiver embodiment of FIG. 1.

FIG. 2 illustrates the receiver 120 of the RF transceiver apparatus 110 shown in FIG. 1 comprising the LNA 210 for amplifying the RF receive signal, the mixer 230 for down-converting the amplified RF receive signal into the BB signal by using the LO signal generated by the LO 240 and the BB amplifier 250 for filtering and amplifying the down-converted BB signal.

Figure 3:
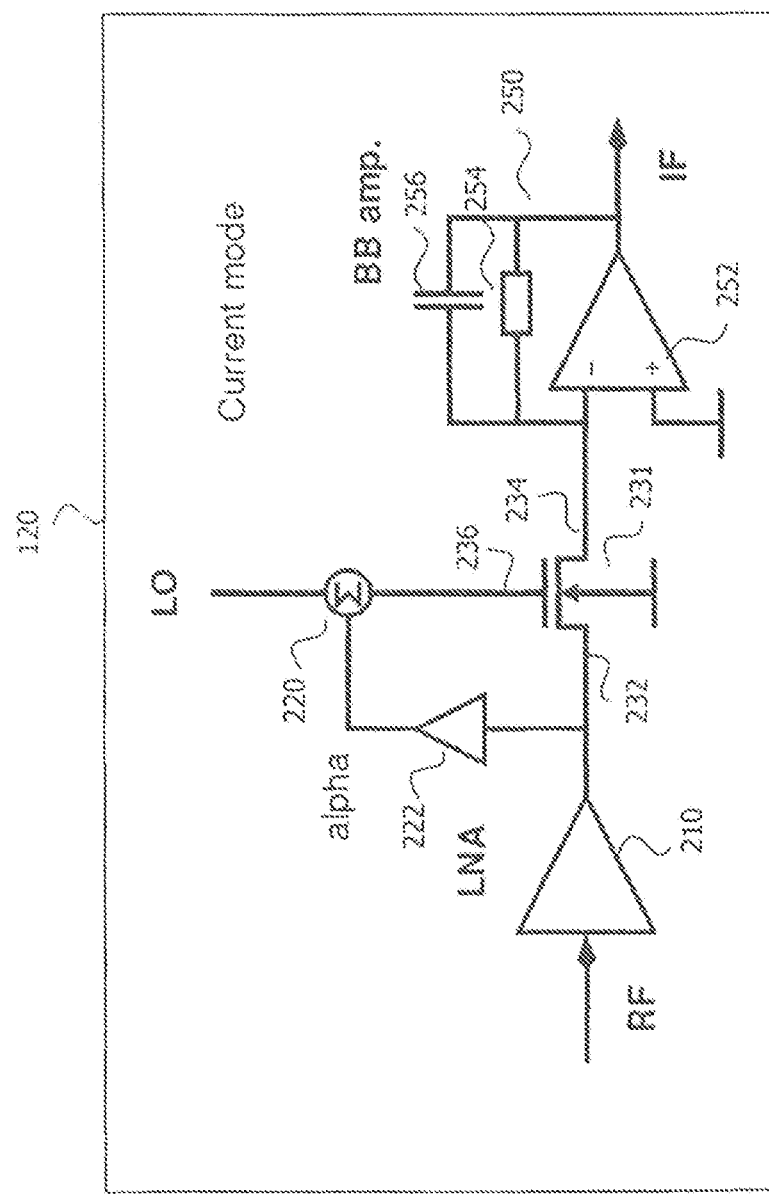
FIG. 3 is a schematic illustration of a first passive mixer embodiment of the receiver shown in FIG. 2.

FIG. 3 schematically illustrates a first passive mixer 230 embodiment of the receiver 120 shown in FIG. 2. As shown in FIG. 3, the passive mixer 230 comprises a MOSFET 231 as a mixing component having a drain, a gate and a source (the bulk is grounded for ease of simplicity), the drain being operatively connected to a first terminal 232, the source being operatively connected to a second terminal 234 and the gate being operatively connected to a third terminal 236 of the passive mixer 230. The first terminal 232 is adapted to receive the RF receive signal (amplified by the LNA 210), the second terminal 234 is adapted to output the BB signal and the third terminal is adapted to receive a third signal, a first cancellation signal, the generation of which will be described in more detail below.

The current through an N-channel MOSFET in its linear region, i.e. when $0<V_{ds}<V_{gs}-V_{th}$, can to a first order be given as $$I_{ds} = \beta \times V_{ds} \times \left(V_{gs} - V_{th} - \frac{V_{ds}}{2}\right) \quad (1)$$

where $I_{ds}$ is the drain-source current, $\beta$ is a geometry dependent constant, $V_{gs}$ is the gate-source voltage, $V_{ds}$ is the drain-source voltage and Vth is the MOSFET threshold voltage. Here, an N-channel device has been assumed but similar relations can easily be derived for P-channel devices. Assuming, without loss of generality, that the source and the second terminal 234 are grounded, there will be two scenarios depending on the polarity of $V_{ds}$, namely the first scenario for $V_{ds}>0$ and the second scenario for $V_{ds}<0$. For $V_{ds}>0$, the second terminal 234 will act as the source, i.e. the voltage at the source $V_s$ will be equal to zero (grounded) ($V_s=0$), and the first terminal 232 will act as the drain, i.e. the voltage at the drain $V_d$ will be equal to the voltage of the RF signal $V_{rf}$ ($V_d=V_{rf}$). For $V_{ds}<0$, the drain and source are swapped ($V_d=0$ and $V_s=V_{rf}$).

For the first scenario (Vds>0), the drain-source current Ids becomes by means of equation (1)

$$I_{ds} = \beta \times V_{rf} \times \left(V_{lo} - V_{th} - \frac{V_{rf}}{2}\right) \quad (2)$$

and for the second scenario ($V_{ds}<0$), the drain-source current Ids becomes by means of equation (1)

$$I_{ds} = -\beta \times V_{rf} \times \left(V_{lo} - V_{rf} - V_{th} + \frac{V_{rf}}{2}\right) = -\beta \times V_{rf} \times \left(V_{lo} - V_{th} - \frac{V_{rf}}{2}\right) \quad (3)$$

where $V_{lo}$ is the voltage of the LO signal which is equal to the gate-source voltage $V_{gs}$ since the source is grounded. The sign reversal in the drain-source current Ids reflects the change in reference direction due to the terminal swapping.

As can be seen from equations (2) and (3), in both scenarios, there is one linear current component ($V_{rf} \times V_{lo}$) and one second order modulation (IM2) component ($V_{rf} \times V_{rf}/2$). Since the MOSFF switch primarily works in the linear region, the above equations (2) and (3) describe the main influence of the nonlinear channel conductance on the mixer current.

By superimposing a fraction of the RF signal on the LO signal by weighting the RF signal with a cancellation value α, i.e. when the gate voltage Vg becomes $$V_g = V_{lo} + \alpha \times V_{rf} \quad (4)$$

the cancellation of the IM2 term can be achieved by choosing the cancellation value α appropriately. Since the source is grounded $V_g$ will equal $V_{gs}$. As shown above, the IM2 component is proportional to $V_{rf} * V_{rf}/2$.

Thus, by selecting α=½ the IM2 component can be cancelled as equation (1) then yields in combination with equation (4)

$$I_{ds} = \beta \times V_{ds} \times \left(V_{gs} - V_{th} - \frac{V_{ds}}{2}\right)$$

$$(1) + (4) = \beta \times V_{rf} \times \left(V_{lo} + \frac{V_{rf}}{2} - V_{th} - \frac{V_{rf}}{2}\right) = \beta \times V_{rf} \times (V_{lo} - V_{th})$$

which is now proportional to $V_{rf}$, i.e. is now linear, when $V_{lo}$ and $V_{th}$ can be considered constant.

Thus, by merely setting the cancellation value α=½, by weighting the RF signal with the cancellation value α and by superimposing (adding) the weighted RF signal on (to) the LO signal, the IM2 component can be canceled.

The latter is exemplarily shown in FIG. 3, where the RF signal is weighted by the amplifier 222 with the cancellation value α (by scaling the drive strength of the first sense amplifier 222 in relation to the LO) and is then added to the LO signal in order to generate the first cancellation signal at the cancellation component 220. The first cancellation signal is then provided to the third terminal 236 (connected to the gate), the RF signal is provided to the first terminal 232 (connected to the drain) and the BB signal is generated as output at the second terminal 234 (connected to the source) by mixing the RF signal and the first cancellation signal.

The above will cancel the IM2 due to the MOSFET 231 switch channel conductance, which covers most of the switch conduction angle. At the switching threshold, the MOSFET 231 will start in the sub-threshold region and will enter the saturation region as soon as any significant current starts to flow through the MOSFET 231. The drain-source current $I_{ds}$ in the saturation region can be described as $$I_{ds} = \frac{\beta}{2} \times (V_{gs} - V_{th})^2 \quad (5)$$

For $V_{ds}>0$, equation (5) yields $$I_{ds} = \frac{\beta}{2} \times (V_{lo} - V_{th})^2 \quad (6)$$

which is proportional to the square of $V_{lo}$ and for $V_{ds}<0$, equation (5) yields $$I_{ds} = \frac{\beta}{2} \times (V_{lo} - V_{rf} - V_{th})^2 \qquad (7)$$

which also has an IM2 term proportional to the square of $V_{rf}$.

In the sub-threshold region, the drain-source current $I_{ds}$ is much smaller and the characteristic is exponential also contributing with some IM2.

When the cancellation value α is selected to deviate slightly from the linear cancellation criterion, i.e. the cancellation value α would be selected to not equal 0.5, the IM2 generated in the sub-threshold region and the saturation region can be compensated by allowing some residual IM2 in the linear region. In other words, the cancellation value α can be tuned such that it nulls the sum of all IM2 contributions but does not null all individual IM2 components separately, e.g. the one in the linear region.

As shown in FIG. 3, the cancellation component 220 is adapted to generate the first cancellation signal for cancelling IM2 components by superimposing the RF receive signal weighted by the cancellation value α on the LO signal. Alternatively to setting the cancellation value α to a fixed value, the first sense amplifier 222 can be used in order to sense the voltage at the first terminal 232. By sensing the voltage at the first terminal 232 the appropriate cancellation value for cancelling the IM2 component can be determined by evaluating equation (1). The unweighted RF receive signal is provided to the first terminal 232 of the MOSFET 231 and the first cancellation signal is provided to the third terminal 236 of the MOSFET 231. By mixing the amplified RF receive signal with the first cancellation signal, the MOSFET 231 switch outputs a BB signal at its source and thus at the second terminal 234 of the mixing component. The BB signal is then filtered and amplified by the BB amplifier 250 comprising, for example as shown in FIG. 3, an amplifier 252, a resistor 254 and a capacitor 256, wherein the resistor 254 and the capacitor are operatively connected to the input and the output of the amplifier 252 for feedback control.

Figure 4:
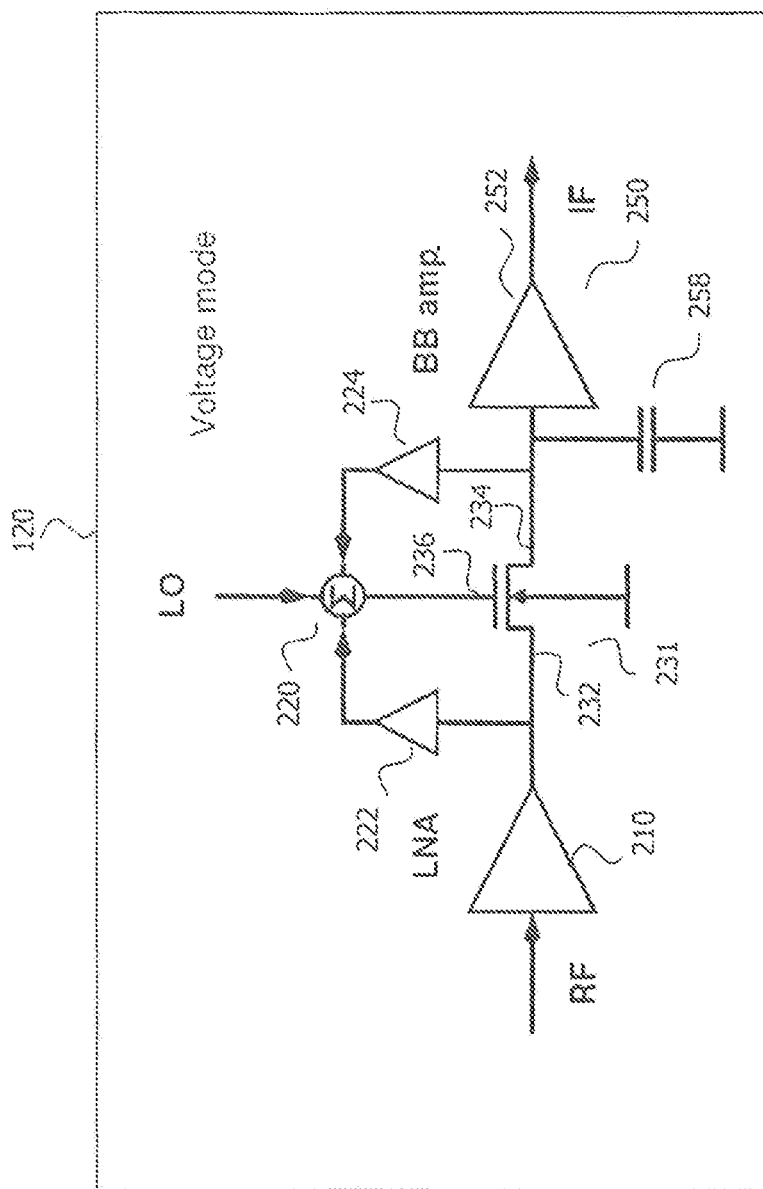
FIG. 4 is a schematic illustration of a second passive mixer embodiment of the receiver shown in FIG. 2.

FIG. 4 shows a second mixer embodiment of the receiver shown in FIG. 2, which is used in voltage mode. In voltage mode, the source of the MOSFET 231 and thus the second terminal 234 are not directly connected to virtual ground but are connected via an impedance, e.g. as shown in FIG. 4 a capacitor 258, to ground, i.e. the MOSFET 231 is loaded by the capacitor 258. In contrast to the first passive mixer embodiment in FIG. 3, the voltage at the second terminal 234 is not close to zero since the second terminal 234 is not connected to virtual ground. Therefore, the voltage at the second terminal 234 has to be considered in equations (1) to (4) in order to determine the drain-source voltage $V_{ds}$ and the gate-source voltage $V_{gs}$. The drain-source voltage $V_{ds}$ is unlike in the first embodiment not merely equal to the RF voltage $V_{rf}$ but is equal to the difference between the RF voltage $V_{rf}$ at the first terminal 232 and the IF voltage $V_s$ at the second terminal 234. Likewise, the gate-source voltage $V_{gs}$ (without any additional cancellation signal) is not merely equal to the voltage of the LO signal $V_{lo}$ but is equal to the difference between the voltage of the LO signal and the source voltage $V_s$ (the voltage at the second terminal 234). Thus, in order to select the cancellation value α, both the drain voltage $V_d$ at the first terminal 232 and the source voltage $V_s$ at the second terminal 234 have to be sensed in order to determine the drain-source voltage $V_{ds}$ and the gate-source voltage $V_{gs}$ of the MOSFET 231.

Since the RF voltage at the first terminal 232 and the IF voltage at the second terminal 234 are widely separated in frequency, they can be sensed independently. In order to sense the voltage at the first terminal 232, the first sense amplifier 222 is used and in order to sense the voltage at the second terminal 234, a second sense amplifier 224 is used. Then, the sensed voltage at the first terminal 232 and the sensed voltage at the second terminal 234 are used to adapt the cancellation value α. The RF signal is weighted by the cancellation value $α_1$ and the IF signal is weighted by the cancellation value $α_2$ and the weighted signals are provided to the cancellation component 220. The cancellation values $α_1$ and $α_2$ may be the same for simplicity or individually set to maximize performance. At the cancellation component 220, the LO signal is superimposed on both the weighted RF signal and the weighted IF signal, in order to generate a first cancellation signal which is then provided to the third terminal 236 and the gate of the MOSFET 231. The output of the second terminal 234 is then again provided to the BB amplifier 252 for amplification and filtering.

Figure 5:
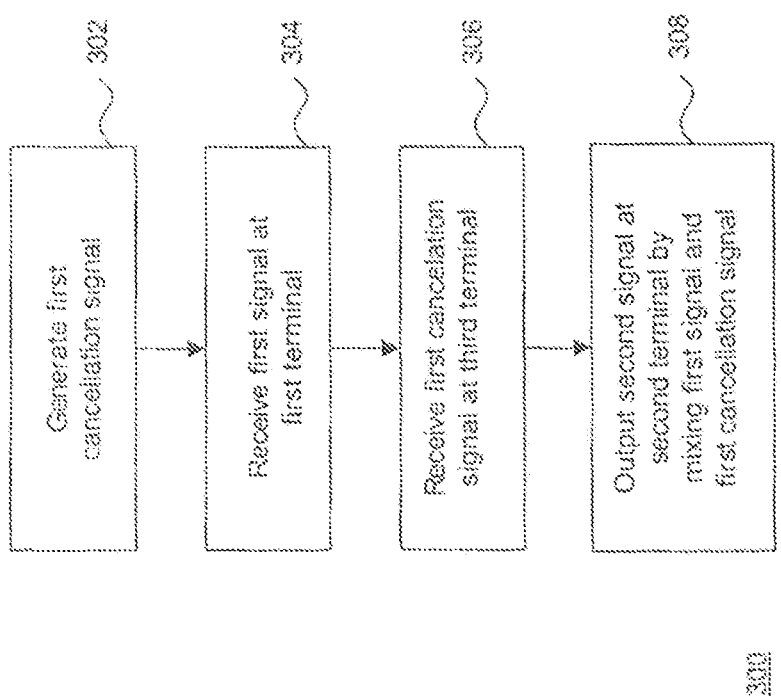
FIG. 5 is a flow chart illustrating a first method embodiment.

The two passive mixer embodiments described above with respect to FIGS. 3 and 4 are further illustrated by the flow chart of FIG. 5 which shows a first method embodiment 300. The method 300 comprises the following steps: Generate first cancellation signal (step 302); Receive first signal at first terminal (step 304); Receive first cancellation signal at third terminal (step 306); and Output second signal at second terminal by mixing first signal and first cancellation signal (step 308).

Figure 6:
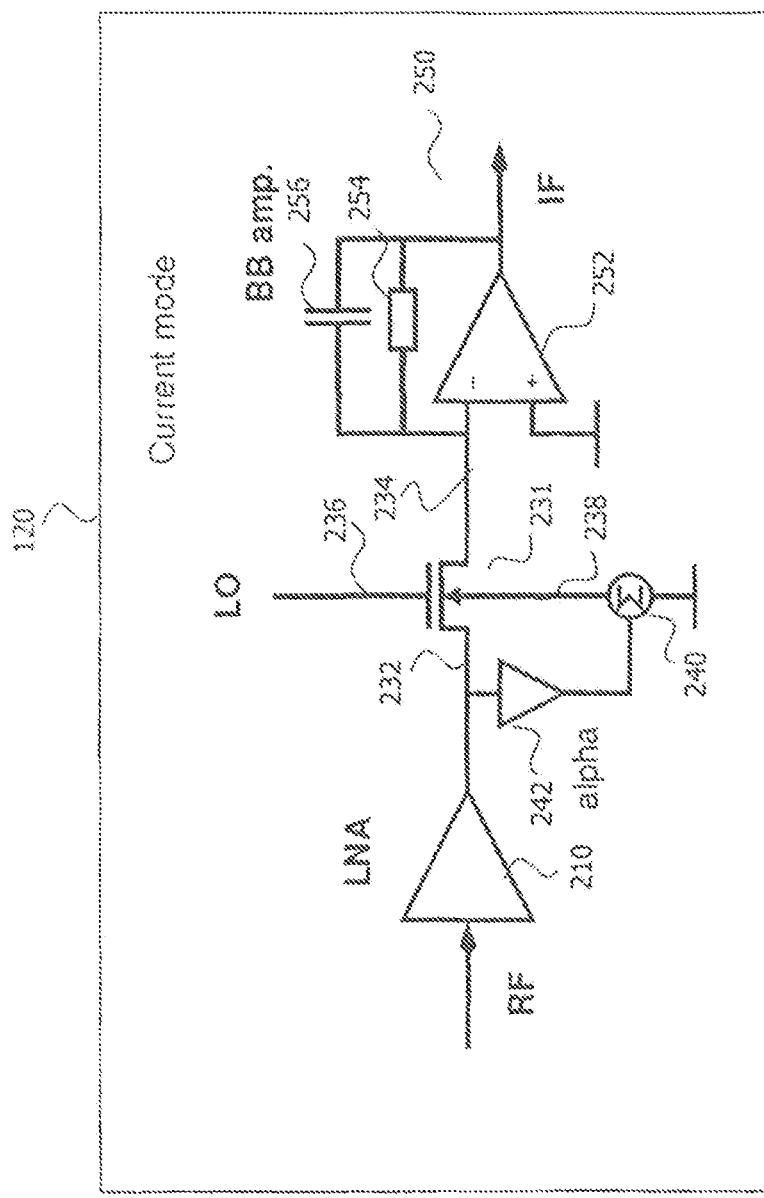
FIG. 6 is a schematic illustration of a third passive mixer embodiment of the receiver shown in FIG. 2.

FIG. 6 shows a third passive mixer embodiment for cancelling second order intermodulation components. The passive mixer is operated in current mode, like in the first passive mixer embodiment of FIG. 3, but in contrast to the first passive mixer embodiment shown in FIG. 3 (and also to the second passive mixer embodiment shown in FIG. 4), the bulk terminal of the MOSFET 231, which is operatively connected to a fourth terminal 238 of the passive mixer, is additionally considered. When additionally considering the bulk terminal 238, the threshold voltage $V_{th}$ is proportional to the bulk-source voltage $V_{bs}$ $$V_{th} = V_{th0} - \gamma \times V_{bs} \qquad (8)$$

where $V_{th0}$ is the unmodulated threshold voltage and $V_{bs}$ is the bulk-source voltage. By injecting (superimposing) a suitably scaled second cancellation signal at the bulk terminal 238, unwanted IM2 components can also be suppressed. When $V_{bs} = α \times V_{rf}$, $α \times γ = ½$, and $V_g = V_{lo}$ (since the source and the second terminal 234 are grounded), the drain-source current Ids yields using equation (1)

$$I_{ds} = \beta \times V_{rf} \times \left( V_{lo} - (V_{th0} - \gamma \times \alpha \times V_{rf}) - \frac{V_{rf}}{2} \right) = \beta \times V_{rf} \times (V_{lo} - V_{th0}) \qquad (9)$$

Thus, the IM2 term is again cancelled with the above assumptions.

Since, in practice, $V_{th}$ is a complex nonlinear function of the bulk, source and drain voltages, the above linearized model is thus not exact, but provides a good estimation. Also because of the small moderate and weak inversion conduction angles, the cancellation criterion $α \times γ$ can be selected to slightly deviate from 0.5 in order to minimize the aggregate IM2 components.

As shown in FIG. 6, the amplified RF receive signal is provided to the drain of the MOSFET 231 and the first sense amplifier 242 is adapted to sense the voltage of the RF signal at the first terminal 232 in order to the select the appropriate cancellation value. The RF receive signal is weighted with the determined cancellation value and is superimposed on a bias voltage at the cancellation component 240 in order to generate the second cancellation signal. The second cancellation signal is provided to the bulk terminal of the MOSFET 231. The MOSFET 231 switch is adapted to mix the amplified RF receive signal provided as input at the drain and the local oscillator signal provided as input at the gate together with the second cancellation signal provided as input at the bulk of the MOSFET 231 in order to generate and output a BB signal at the source. The BB signal is then amplified by the BB amplifier 250.

Figure 7:
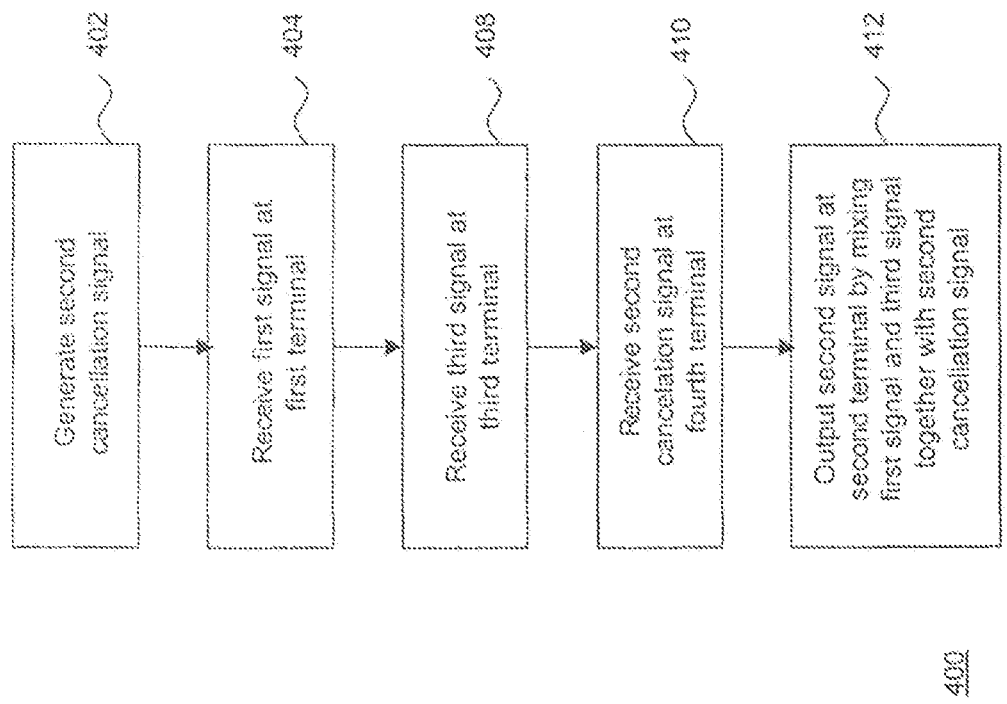
FIG. 7 is a flow chart illustrating a second method embodiment.

The third passive mixer embodiment described above with respect to FIG. 6 is further illustrated by the flow chart of FIG. 7 which shows a second method embodiment 400. The method 400 comprises the following steps: Generate second cancellation signal (step 402); Receive first signal at first terminal (step 404); Receive third signal at third terminal (step 408); Receive second cancellation signal at fourth terminal (step 410); and Output second signal at second terminal by mixing first signal and third signal together with second cancellation signal (step 412).

Figure 8:
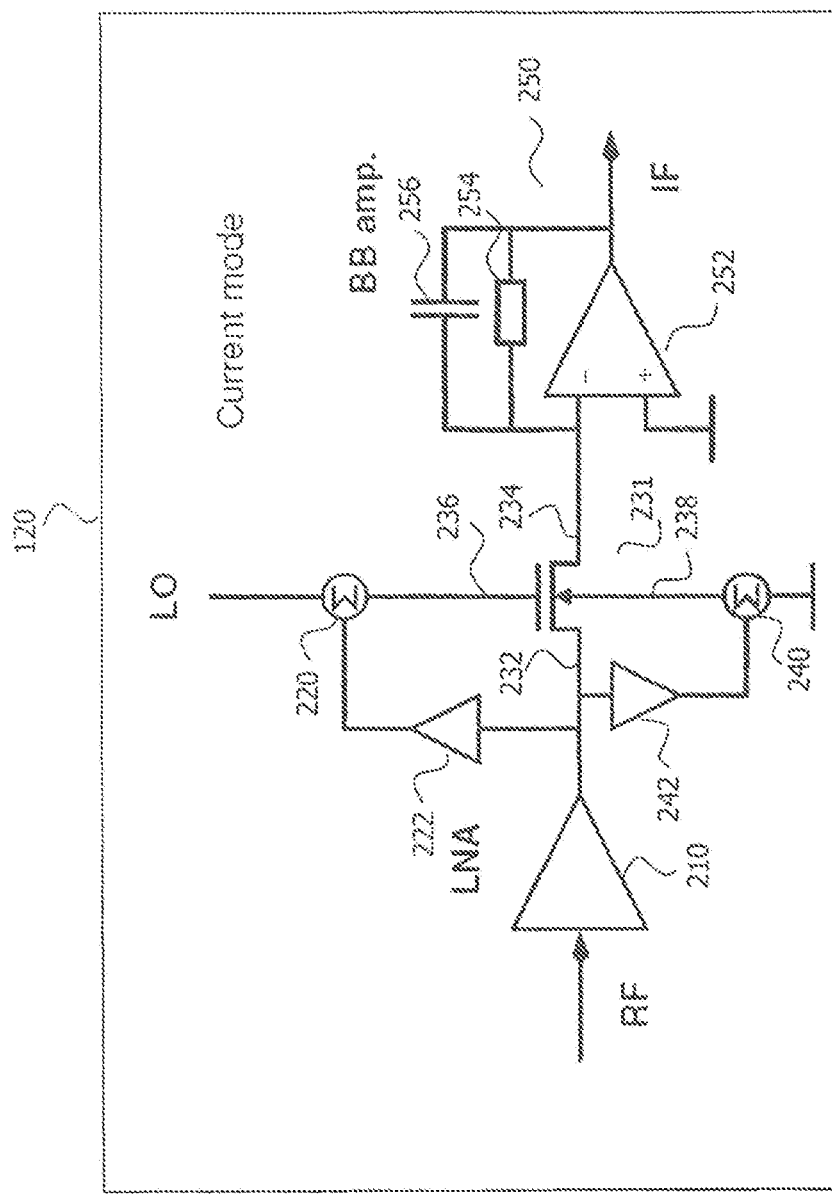
FIG. 8 is a schematic illustration of a fourth passive mixer embodiment of the receiver shown in FIG. 2.

The first passive mixer embodiment of FIG. 3 and the third passive mixer embodiment of FIG. 6 can be combined to a fourth passive mixer embodiment as shown in FIG. 8. In this embodiment, the voltage at the first terminal 232 is sensed by two distinct sense amplifiers 222, 242, a first one 222 connected to the first terminal 232 and the third terminal 236 (via a first cancellation component 220) and a second one 242 connected to the first terminal 232 and the fourth terminal 238 (via a second cancellation component 240). In this way two distinct cancellation values can be determined by the two sense amplifiers 222, 242, i.e. a first cancellation value determined by the first sense amplifier 222 and a second cancellation value determined by the second sense amplifier 242. Then, a first cancellation signal is determined by adding the RF signal weighted by the first cancellation value to the LO signal and a second cancellation signal is determined by adding the RF signal weighted by the second cancellation value on a bias voltage. As shown in FIG. 8, the first cancellation signal is input to the gate of the MOSFET 231 via the third terminal 236 and the second cancellation signal is input to the bulk of the MOSFET 231 via the fourth terminal 238. By mixing the first signal provided as input at the drain and the first cancellation signal provided as input at the gate together with the second cancellation signal provided as input at the bulk, a BB signal is provided at the source of the MOSFET 231 and the second terminal 234. The BB signal is finally filtered and amplified by a BB amplifier 250.

Figure 9:
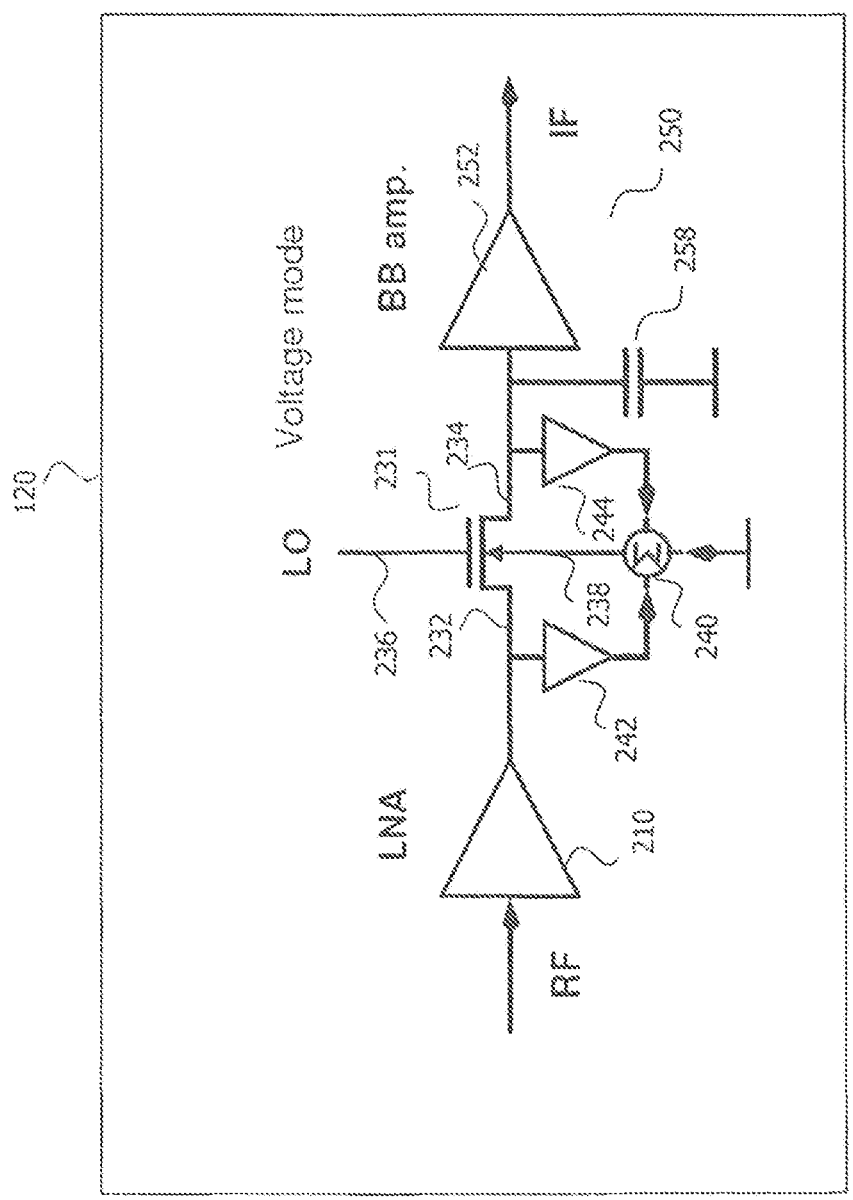
FIG. 9 is a schematic illustration of a fifth passive mixer embodiment of the receiver shown in FIG. 2.

In the fifth passive mixer embodiment of FIG. 9, like in the fourth embodiment of FIG. 8, also an additional sense amplifier 244 is added to the third passive mixer embodiment of FIG. 6. Unlike the fourth embodiment shown in FIG. 8, the additional (second) sense amplifier 244 is connected between the second terminal 234 and the second cancellation component 240 rather than to the first terminal 232 and the first cancellation component 220. In this way, the fifth passive mixer embodiment shown in FIG. 9 operates in voltage mode. The RF receive signal is weighted with a first cancellation value (determined by the first sense amplifier 242 by sensing the voltage at the first terminal 232) and, in addition thereto, the voltage (BB voltage) at the second terminal 234 is sensed by the second sense amplifier 244 so that the BB signal is weighted by a second cancellation value (determined by the second sense amplifier 244 by sensing the voltage at the second terminal 234). Both the RF signal weighted by the first cancellation value and the IF signal (BB signal) weighted by the second cancellation value are added to a bias voltage at the cancellation component 240 in order to generate the second cancellation signal. The second cancellation signal is provided to the bulk terminal of the MOSFET 231. The MOSFET 231 switch is adapted to mix the amplified RF receive signal provided as input at the drain and the local oscillator signal provided as input at the gate together with the second cancellation signal provided as input at the bulk of the MOSFET 231 in order to generate and output a BB signal at the source. The BB signal is then amplified by the BB amplifier 250.

Figure 10:
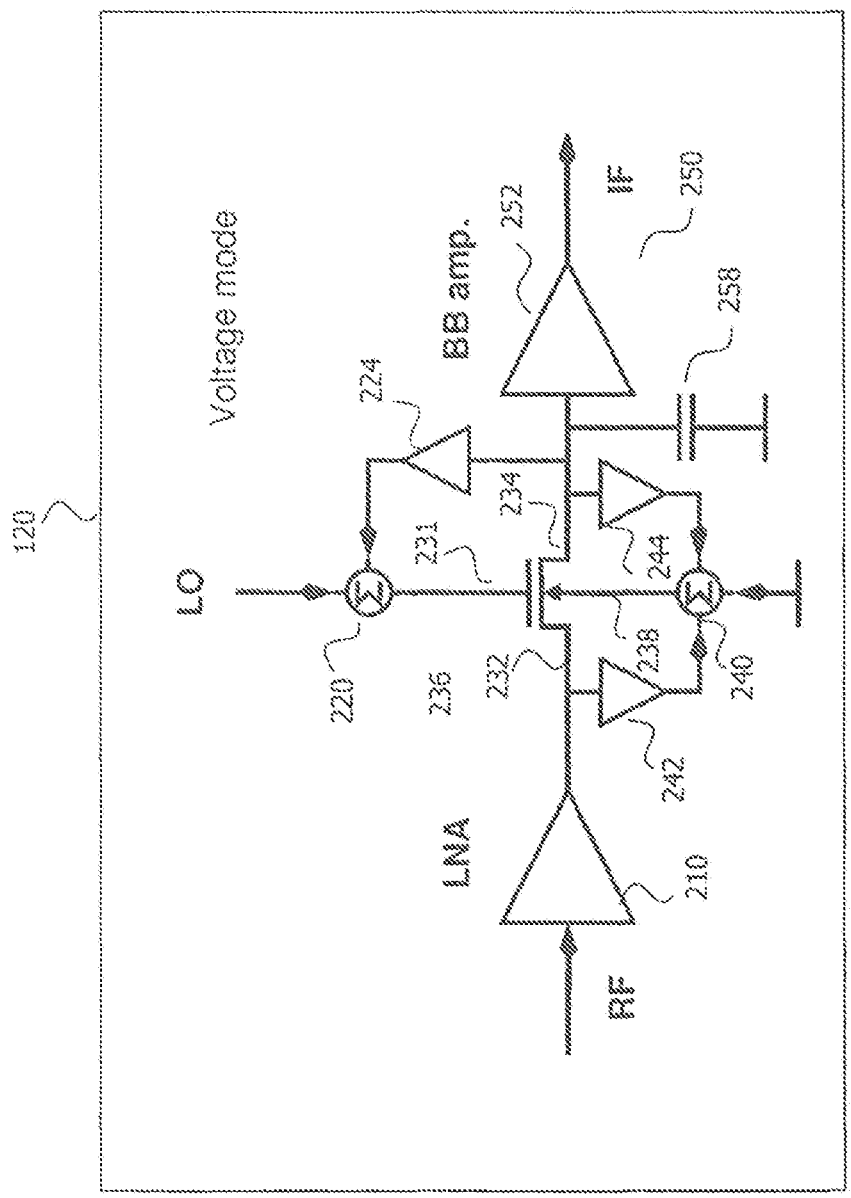
FIG. 10 is a schematic illustration of a sixth passive mixer embodiment of the receiver shown in FIG. 2.

In the sixth passive mixer embodiment shown in FIG. 10, a further sense amplifier 224 is added to the fifth passive mixer embodiment of FIG. 9. The second cancellation signal which is provided to the bulk of the MOSFET 231, is determined in the way as described with respect to FIG. 9 above. In addition thereto, the further sense amplifier 224 is adapted to sense the voltage at the second terminal (like the sense amplifier 244). Although the sense amplifier 244 and the sense amplifier 224 are both adapted to sense the voltage at the second terminal 234, the BB signal can be weighted with different cancellation values by the two amplifiers 224, 244. The BB signal weighted by one cancellation value is supplied to the second cancellation component 240 (to generate the second cancellation signal) and the BB signal weighted by the same or a different cancellation value is supplied to the first cancellation component 220 to be added to the LO signal in order to generate the first cancellation signal. By mixing the amplified RF receive signal provided as input at the drain and the first cancellation signal provided as input at the gate together with the second cancellation signal provided as input at the bulk of the MOSFET 231, a BB signal is generated and output at the source and finally filtered and amplified by a BB amplifier 250.

Figure 11:
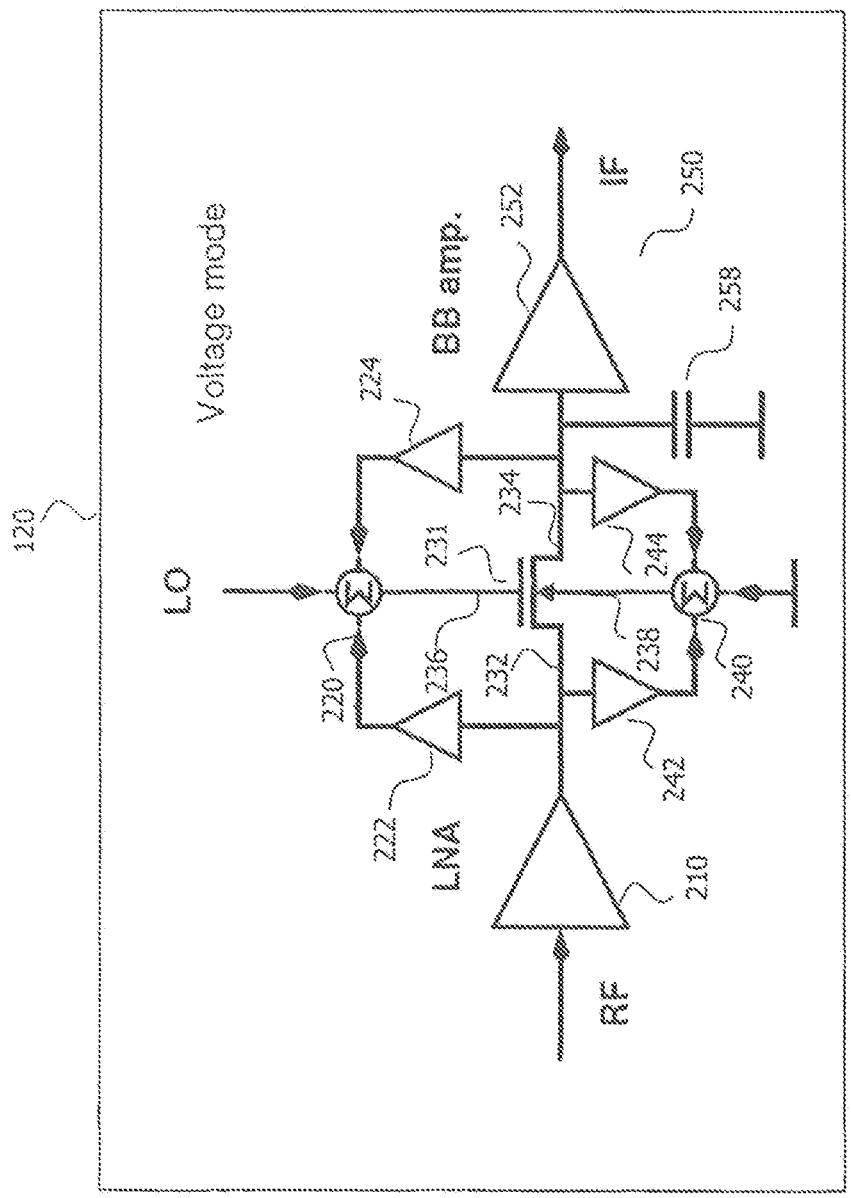
FIG. 11 is a schematic illustration of a seventh passive mixer embodiment of the receiver shown in FIG. 2.

The seventh passive mixer embodiment shown in FIG. 11 is a combination of the previously described first to sixth passive mixer embodiments. In this embodiment, a first cancellation signal is generated by superimposing the RF signal weighted by a cancellation value and the BB signal weighted by a cancellation value on the LO signal at the first cancellation component 220 and a second cancellation signal is generated by superimposing the RF signal weighted by a cancellation value and the BB signal weighted by a cancellation value on the bulk voltage at the second cancellation component 240. The first and second cancellation signals are then provided to the respective terminals of the MOSFET 231 (the gate and bulk) in order to generate the BB signal at the source as described above with respect to the first to sixth embodiments.

Figure 12:
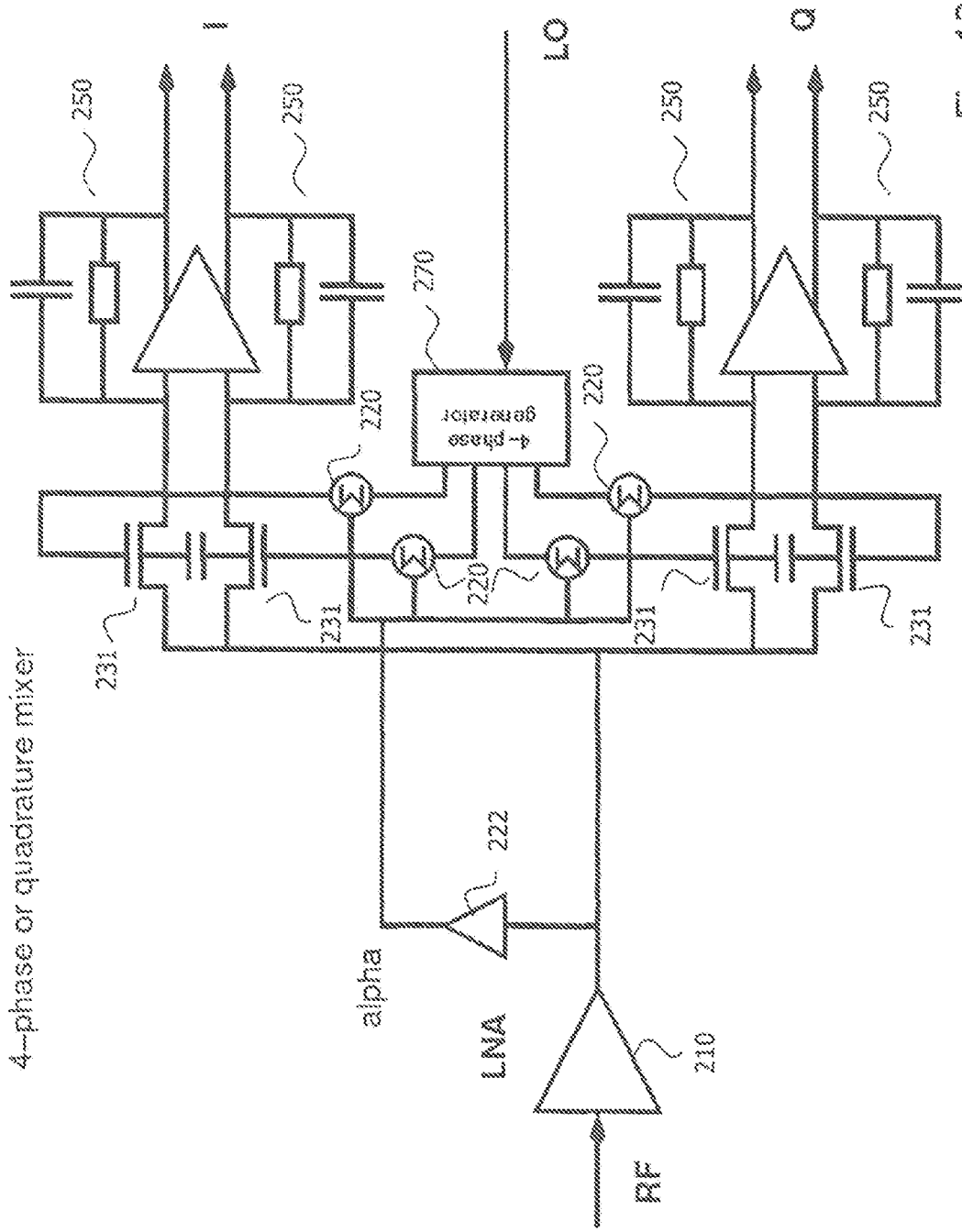
FIG. 12 is a schematic illustration of an eighth passive mixer embodiment of a receiver shown in FIG. 2.

An eighth passive mixer embodiment is shown in FIG. 12. According to this embodiment, a more-phase generator, exemplarily shown as a 4-phase generator 270 in FIG. 12, is provided. The 4-phase generator comprises two opposing signal sources in order to generate different phases of the LO signal received by the 4-phase generator 270 as input. The RF receive signal (amplified by the LNA 210) is provided at the drain of four MOSFETs 231 shown in FIG. 12. In the same manner as described above, the voltage of the RF signal (the voltage at the drain of the four MOSFETs 230) is sensed by the first sense amplifier 222 and the RF receive signal is weighted with a cancellation value by the first sense amplifier 222. The weighted RF receive signal is then added to the different phases generated by the 4-phase generator 270 at the respective cancellation components 220. The RF signals applied to the respective cancellation components 220 may be weighted with the same or with different cancellation values. If required by the operating conditions (mismatch, process speed, temperature and the like), the RF signal can be weighted with a first cancellation value and can be added (at a first cancellation component 220) to the first phase of the LO signal generated by the 4-phase generator 270 and the RF signal can be weighted by a second cancellation value (different from the first cancellation value) and can be added (at a second cancellation component 220) to the second phase of the LO signal generated by the 4-phase generator and so on. In this way the appropriate cancellation signals are determined.

The RF signal is then mixed by the four MOSFETs 231 with the respective cancellation signals in the same manner as described above to output BB (or IF) signals at the source of the MOSFETs 231 which are finally filtered by the BB amplifiers 250 in order to generate I and Q quadrature components.

The ninth passive mixer embodiment illustrated in FIG. 13 differs from the eighth passive mixer embodiment of FIG. 12 in that the weighted RF signal is superimposed on the bias voltage of the MOSFETs 231 rather than on the different phases of the LO signal. The different phases of the LO signal are instead supplied to the gate of the MOSFETs 231. At each MOSFET 231 the RF signal provided as input at the drain is mixed with the respective phase of the LO signal provided as input at the gate together with the cancellation signal provided as input at the bulk, in order to generate the BB (or IF) signal.

Figure 14:
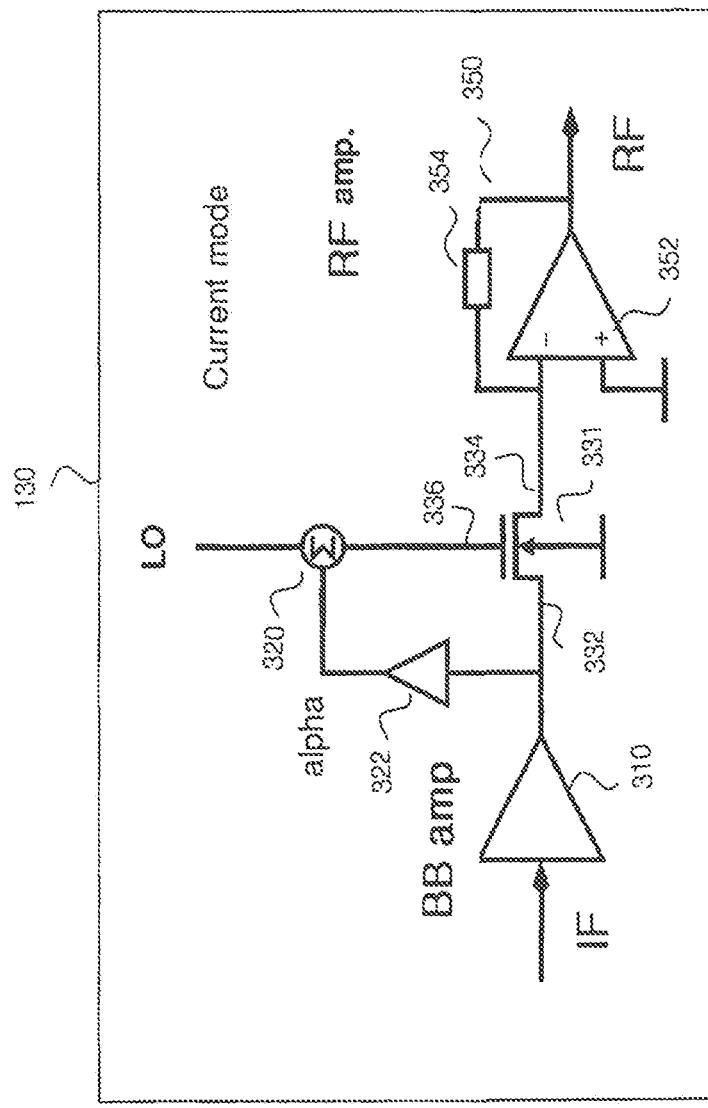
FIG. 14 is a schematic illustration of a current-mode passive mixer embodiment of a transmitter shown in FIG. 1.

Although described herein primarily in the context of a receiver circuit, the IM2-suppressing passive mixer of the present invention is not limited to receiver implementations, but additionally finds utility in reducing the IM2, and consequently raising the IP2, in transmitter circuits. For example, FIG. 14 shows one embodiment of a passive mixer 330, deployed in the transmitter 130 shown in FIG. 1. As shown in FIG. 3, the passive mixer 330 comprises a MOSFET 331 as a mixing component having a drain, a gate and a source (the bulk is grounded for ease of simplicity), the drain being operatively connected to a first terminal 332, the source being operatively connected to a second terminal 334 and the gate being operatively connected to a third terminal 336 of the passive mixer 330. The first terminal 332 is adapted to receive a BB or IF signal (amplified by a BB or IF amplifier 310), the second terminal 334 is adapted to output the RF signal and the third terminal is adapted to receive a third signal, which is a first cancellation signal.

In one embodiment, the first cancellation signal is generated by setting a cancellation value $\alpha=\frac{1}{2}$, by weighting the BB or IF signal with the cancellation value $\alpha$ and by superimposing (adding) the weighted BB or IF signal on (to) the LO signal. The first cancellation signal thus cancels the IM2 component, in a manner similar to that described with respect to the receiver circuit of FIG. 3.

In FIG. 14, the BB or IF signal is weighted by the amplifier 322 with the cancellation value $\alpha$ (by scaling the drive strength of the first sense amplifier 322 in relation to the LO) and is then added to the LO signal in order to generate the first cancellation signal at the cancellation component 320. The first cancellation signal is then provided to the third terminal 336 (connected to the gate), the BB or IF signal is provided to the first terminal 332 (connected to the drain) and the RF signal is generated as output at the second terminal 334 (connected to the source) by mixing the BB or IF signal and the first cancellation signal.

As described above with respect to the passive mixer in the receiver circuit 120 of FIG. 3, when the cancellation value $\alpha$ is selected to deviate slightly from the linear cancellation criterion, i.e. the cancellation value $\alpha$ would be selected to not equal 0.5, the IM2 generated in the sub-threshold region and the saturation region can be compensated by allowing some residual IM2 in the linear region. In other words, the cancellation value $\alpha$ can be tuned such that it nulls the sum of all IM2 contributions but does not null all individual IM2 components separately, e.g. the one in the linear region.

As shown in FIG. 14, the cancellation component 320 is adapted to generate the first cancellation signal for cancelling IM2 components by superimposing the BB or IF signal weighted by the cancellation value $\alpha$ on the LO signal. In one embodiment, alternatively to setting the cancellation value $\alpha$ to a fixed value, the first sense amplifier 322 can be used in order to sense the voltage at the first terminal 332. By sensing the voltage at the first terminal 332 the appropriate cancellation value for cancelling the IM2 component can be determined by evaluating equation (1). The unweighted BB or IF signal is provided to the first terminal 332 of the MOSFET 331 and the first cancellation signal is provided to the third terminal 336 of the MOSFET 331. By mixing the amplified BB or IF signal with the first cancellation signal, the MOSFET 331 switch outputs an RF signal at its source and thus at the second terminal 334 of the mixing component. The RF signal is then filtered and amplified by the RF amplifier 350 comprising, for example as shown in FIG. 14, an amplifier 352 having a resistor 354 operatively connected to the input and the output of the amplifier 352 for feedback control.

Figure 15:
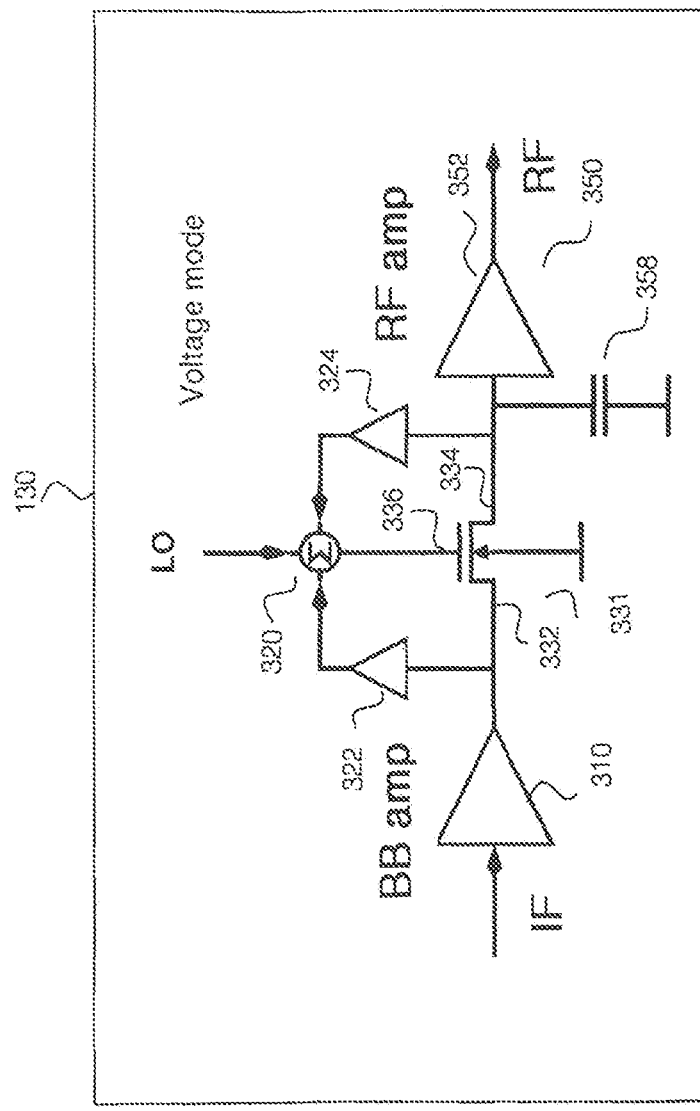
FIG. 15 is a schematic illustration of a voltage-mode passive mixer embodiment of a transmitter shown in FIG. 1.

FIG. 15 shows an embodiment of a passive mixer 330, deployed in the transmitter 130 shown in FIG. 1, which is used in voltage mode. In voltage mode, the source of the MOSFET 331 and thus the second terminal 334 are not directly connected to virtual ground, but rather are connected via an impedance, e.g. as shown in FIG. 15, a capacitor 358, to ground. That is, the MOSFET 331 is loaded by the capacitor 358. In contrast to the passive mixer embodiment in FIG. 14, the voltage at the second terminal 334 is not close to zero, since the second terminal 334 is not connected to virtual ground. Therefore, the voltage at the second terminal 334 has to be considered in equations (1) to (4) in order to determine the drain-source voltage $V_{ds}$ and the gate-source voltage $V_{gs}$. The drain-source voltage $V_{ds}$ is, unlike in the embodiment of FIG. 14, not merely equal to the RF voltage $V_{rf}$, but it is equal to the difference between the BB or IF voltage $V_{bb}$ or $V_{if}$ at the first terminal 332 and the RF voltage $V_s$ at the second terminal 334. Likewise, the gate-source voltage $V_{gs}$ (without any additional cancellation signal) is not merely equal to the voltage of the LO signal $V_{lo}$ but is equal to the difference between the voltage of the LO signal and the source voltage $V_s$ (the voltage at the second terminal 334). Thus, in order to select the cancellation value $\alpha$, both the drain voltage $V_d$ at the first terminal 332 and the source voltage $V_s$ at the second terminal 334 have to be sensed in order to determine the drain-source voltage $V_{ds}$ and the gate-source voltage $V_{gs}$ of the MOSFET 331.

Since the BB or IF voltage at the first terminal 332 and the RF voltage at the second terminal 334 are widely separated in frequency, they can be sensed independently. In order to sense the voltage at the first terminal 332, the first sense amplifier 322 is used and in order to sense the voltage at the second terminal 334, a second sense amplifier 324 is used. Then, the sensed voltage at the first terminal 332 and the sensed voltage at the second terminal 334 are used to adapt the cancellation value $\alpha$. The BB or IF signal is weighted by the cancellation value $\alpha_1$ and the RF signal is weighted by the cancellation value $\alpha_2$ and the weighted signals are provided to the cancellation component 230. The cancellation values $\alpha_1$ and $\alpha_2$ may be the same for simplicity or individually set to maximize performance. At the cancellation component 320, the LO signal is superimposed on both the weighted BB or IF signal and the weighted RF signal, in order to generate a first cancellation signal which is then provided to the third terminal 336 and the gate of the MOSFET 331. The output of the second terminal 334 is then again provided to the RF amplifier 352 for amplification and filtering.

Those of skill in the art will readily recognize that all embodiments of the passive mixer described herein in the context of a receiver (e.g., as depicted in FIGS. 3-4, 6, 8-13) may similarly be advantageously deployed in a transmitter circuit to reduce IM2 and hence raise the IP2.

The technique described above results in noticeable IM2 improvements on the order of 20 dB, in particular for the current mode mixer. This significant improvement leads to decreased duplexer requirements and therefore to lower costs, smaller size and smaller losses. For frequency bands where the duplexer Tx-Rx isolation is below the typically required 50 dB, the described technique eliminates the need for a SAW interstage filter between the LNA and the mixer, which also improves band flexibility and reduces the costs and size of the receiver structures and the devices.

What is claimed is:

1. A passive mixer adapted to convert a first signal having a first frequency into a second signal having a second frequency by using a third signal having a third frequency, comprising:
    a first cancellation component adapted to generate a first cancellation signal operative to substantially cancel second order intermodulation components by adding the first signal weighted by a first cancellation value, so as to alter its amplitude, on the third signal; and
    a mixing component having a first terminal adapted to receive the first signal, a second terminal adapted to output the second signal, and a third terminal adapted to receive the first cancellation signal, wherein the mixing component is adapted to provide the second signal as output at the second terminal by mixing the first signal provided as input at the first terminal and the first cancellation signal provided as input at the third terminal; and
    a first active sensing component adapted to sense a voltage at the first terminal and to adapt the first cancellation value based on the sensed voltage at the first terminal.

2. The passive mixer according to claim 1, wherein the mixing component comprises a pair of two complementary voltage controlled switches, wherein the two complementary voltage controlled switches are connected in parallel, share the first terminal, and each have a distinct third terminal.

3. The passive mixer according to claim 1, wherein the mixing component comprises a field effect transistor switch having its drain operatively connected to the first terminal, its gate operatively connected to the third terminal and its source operatively connected to the second terminal.

4. The passive mixer according to claim 1, wherein the mixing component comprises a field effect transistor switch having its source operatively connected to the first terminal, its gate operatively connected to the third terminal and its drain operatively connected to the second terminal.

5. The passive mixer according to claim 1, further comprising:
    a second cancellation component adapted to generate a second cancellation signal operative to substantially cancel second order intermodulation components by adding the first signal weighted by a second cancellation value on a bias voltage; and
    a second sensing component adapted to sense the voltage at the first terminal and to adapt the second cancellation value based on the sensed voltage at the first terminal; and
    wherein the mixing component further has a fourth terminal adapted to receive the second cancellation signal, and wherein the mixing component is adapted to provide the second signal as output at the second terminal by mixing the first signal provided as input at the first terminal, the first cancellation signal provided as input at the third terminal, and the second cancellation signal provided as input at the fourth terminal.

6. The passive mixer according to claim 5, further comprising:
    a third sensing component adapted to sense the voltage at the second terminal, wherein the first cancellation component is adapted to generate the first cancellation signal by additionally considering the sensed voltage at the second terminal; and
    a fourth sensing component adapted to sense the voltage at the second terminal, wherein the second cancellation component is adapted to generate the second cancellation signal by additionally considering the sensed voltage at the second terminal.

7. The passive mixer according to claim 1, further comprising two or more mixing components and a corresponding number of cancellation components, and a more-phase generator adapted to generate the third signal with two or more different phases and to individually feed the different phases of the third signal into one or more of the two or more mixing components.

8. The passive mixer according to claim 7, wherein the more-phase generator comprises a four-phase generator, and wherein the cancellation components may be weighted with the same or different cancellation values.

9. The passive mixer according to claim 7, wherein the first cancellation component is adapted to generate the first cancellation signal by superimposing the first signal weighted by the first cancellation value on one phase of the third signal and by superimposing the first signal weighted by the same or an adapted cancellation value on another phase of the third signal.

10. The passive mixer according to claim 1, wherein the first signal is a radio frequency signal, the third signal is a local oscillator signal, and the second signal is one of an intermediate frequency signal and a baseband signal.

11. The passive mixer according to claim 1, wherein the first signal is one of an intermediate frequency signal and a baseband signal, the third signal is a local oscillator signal, and the second signal is a radio frequency signal.

12. The passive mixer according to claim 1, wherein first cancellation value is 0.5.

13. A transceiver apparatus comprising a transmitter adapted to transmit a radio frequency transmit signal and a receiver adapted to receive a radio frequency receive signal, wherein the receiver comprises:
- a low noise amplifier adapted to amplify the radio frequency receive signal; and
- a passive mixer comprising:
  - a local oscillator adapted to generate a local oscillator signal;
  - a cancellation component adapted to generate a first cancellation signal to substantially cancel second order intermodulation components by superimposing the amplified radio frequency receive signal weighted by a cancellation value, so as to alter its amplitude, on the local oscillator signal; and
  - a mixing component having a first terminal adapted to receive the amplified radio frequency receive signal, a second terminal adapted to output one of an intermediate frequency signal and a baseband signal, and a third terminal adapted to receive the first cancellation signal, wherein the mixing component is adapted to provide one of the intermediate frequency signal and the baseband signal as output at the second terminal by mixing the amplified radio frequency receive signal provided as input at the first terminal and the first cancellation signal provided as input at the third terminal.

14. The transceiver apparatus according to claim 13, wherein the receiver further comprises one of a bandpass filter and a lowpass filter connected to the second terminal, wherein the bandpass filter has a passband of a predetermined frequency range adapted to filter the intermediate frequency signal and the lowpass filter has a passband of a predetermined frequency range adapted to filter the baseband signal.

15. A transceiver apparatus comprising a transmitter adapted to transmit a radio frequency transmit signal and a receiver adapted to receive a radio frequency receive signal, wherein the transmitter comprises:
- an amplifier adapted to amplify one of an intermediate frequency signal and a baseband signal to be transmitted; and
- a passive mixer comprising:
  - a local oscillator adapted to generate a local oscillator signal;
  - a cancellation component adapted to generate a first cancellation signal to substantially cancel second order intermodulation components by superimposing the amplified intermediate frequency signal or baseband signal weighted by a cancellation value, so as to alter its amplitude, on the local oscillator signal; and
  - a mixing component having a first terminal adapted to receive the amplified intermediate frequency signal or baseband signal, a second terminal adapted to output a radio frequency transmit signal, and a third terminal adapted to receive the first cancellation signal, wherein the mixing component is adapted to provide the radio frequency transmit signal as output at the second terminal by mixing the amplified intermediate frequency signal or baseband signal provided as input at the first terminal and the first cancellation signal provided as input at the third terminal.

16. A method, performed by a passive mixer, of converting a first signal having a first frequency into a second signal having a second frequency by using a third signal having a third frequency, comprising:
- receiving, at a first terminal of a mixing component, the first signal;
- receiving, at a third terminal of the mixing component, a first cancellation signal;
- sensing, by a first sensing component, a voltage at the first terminal;
- adapting a cancellation value based on the sensed voltage at the first terminal;
- generating, by a cancellation component, the first cancellation signal to substantially cancel second order intermodulation components by superimposing the first signal weighted by the cancellation value, so as to alter its amplitude, on the third signal; and
- outputting, at a second terminal of the mixing component, the second signal by mixing the first signal provided as input at the first terminal and the first cancellation signal provided as input at the third terminal.

17. The method of claim 16, wherein the voltage at the second terminal is sensed by a second sensing component and the first cancellation signal is generated by additionally considering the sensed voltage at the second terminal.

* * * * *